(12) United States Patent
Aoki et al.

(10) Patent No.: US 8,574,479 B2
(45) Date of Patent: Nov. 5, 2013

(54) IMPRINTING METHOD AND IMPRINTING APPARATUS

(75) Inventors: Akio Aoki, Shimotsuga-gun (JP); Hiroshi Inada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 12/876,040

(22) Filed: Sep. 3, 2010

(65) Prior Publication Data
US 2011/0057354 A1   Mar. 10, 2011

(30) Foreign Application Priority Data

Sep. 10, 2009   (JP) ................. 2009-209541

(51) Int. Cl.
*B28B 11/08* (2006.01)
(52) U.S. Cl.
USPC .......... 264/293; 425/385; 427/96.1; 427/331; 427/424; 427/427.1; 427/427.2; 427/427.3
(58) Field of Classification Search
USPC .......... 425/385; 264/293; 427/96.1, 331, 424, 427/427.1, 427.2, 427.3; 118/696, 697
See application file for complete search history.

(56) References Cited

U.S. PATENT DOCUMENTS

| | | | |
|---|---|---|---|
| 7,360,851 B1 * | 4/2008 | Snyder | ............................. 347/2 |
| 8,142,850 B2 | 3/2012 | Sreenivasan et al. | |
| 2006/0115999 A1 * | 6/2006 | Sreenivasan et al. | ......... 438/780 |
| 2006/0192320 A1 * | 8/2006 | Tokita et al. | .................. 264/293 |
| 2008/0090170 A1 | 4/2008 | Yoneda | |

FOREIGN PATENT DOCUMENTS

| | | |
|---|---|---|
| JP | 2007-266053 A | 10/2007 |
| JP | 2008-091782 A | 4/2008 |
| JP | 4185941 B2 | 11/2008 |

* cited by examiner

*Primary Examiner* — Joseph S Del Sole
*Assistant Examiner* — David N Brown, II
(74) *Attorney, Agent, or Firm* — Canon U.S.A., Inc., IP Division

(57) ABSTRACT

In an imprinting method for transferring a pattern of a mold to a resin coated on a substrate by using an imprinting apparatus including a mold holding unit and a resin coating unit, the resin is coated in n shot areas arranged in a direction parallel to a direction in which the holding unit and the coating unit are arranged where n is an integer equal to or greater than 2, and the pattern is transferred to the shot areas on a one-by-one basis. A distance D between the coating unit and the mold and a width W of each shot area as seen in the direction parallel to the direction in which the holding unit and the coating unit are arranged are selected so as to satisfy a condition $D > (3/2 - 1/n)W$, and the coating and the transferring are performed repeatedly on the substrate.

9 Claims, 15 Drawing Sheets

IMPRINTING METHOD AND IMPRINTING APPARATUS

BACKGROUND OF THE INVENTION

1. Field of the Invention

The present invention relates to an imprinting apparatus and an imprinting method for transferring a pattern of a mold to a resin coated on a substrate.

2. Description of the Related Art

An imprinting technique refers to a technique to form a pattern on a resin coated on a substrate such as a silicon wafer, a glass plate or the like by transferring the pattern formed on a mold to the resin. More specifically, the mold having the pattern is pressed against the resin coated on the substrate, and, while maintaining this state, the resin is cured thereby forming the pattern in the resin.

One of imprinting techniques practically used today is that using a photocuring process. In the photocuring method, a photocuring resin is coated on a substrate, and a mold having a pattern is pressed against the substrate via the resin. While maintaining the state in which the mold is pressed against the substrate, the resin is illuminated with light such as ultraviolet light or the like to cure the resin. Thereafter, the mold is removed from the resin. The pattern remains in the resin on the substrate.

To form a pattern in a plurality of shot areas using the imprinting technique, it is known to perform the coating of resin and the transferring of the pattern repeatedly for the plurality of shot areas on the substrate on a one-by-one basis (Japanese Patent No. 4185941).

To transfer the pattern to a particular shot area using the conventional imprinting technique described above, first, the substrate is moved such that the shot area comes to a coating position at which the coating is to be performed by a coating unit. The coating unit is a unit configured to coat resin on the substrate. After the coating of resin is completed, the substrate is moved such that the shot area coated with the resin comes to a transfer position at which the pattern of the mold held by a mold head is to be transferred to the shot area, and the transferring of the pattern is performed. In the imprinting apparatus designed to perform the above-described process, the coating unit for coating resin and the mold head that is movable up and down to transfer the pattern are disposed such that they are located in a horizontal line. To form the pattern in a plurality of shot areas on the substrate, it is necessary to move the substrate many times such that each shot area is moved between the coating position and the pattern transferring position. The time spent to perform this movement cannot be neglected to improve the throughput of the imprinting apparatus. That is, the movement of the substrate is one of significant factors that determine the throughput of the imprinting apparatus.

SUMMARY OF THE INVENTION

In view of the above, the present invention provides a technique to reduce the amount of movement of a substrate in the process of coating resin and transferring a pattern so as to increase the throughput.

In an aspect, the present invention provides an imprinting method for transferring a pattern from a mold to a resin coated on a substrate by using an imprinting apparatus including a holding unit configured to hold the mold and a coating unit configured to coat the resin on the substrate, the method comprising coating the resin in n shot areas arranged in a direction parallel to a direction in which the holding unit and the coating unit are arranged where n is an integer equal to or greater than 2, and after coating of the resin in the n shot areas is performed, transferring the pattern to the shot areas on a one-by-one basis, wherein a distance D between the coating unit and the mold and a width W of each shot area as seen in a direction parallel to a direction in which the holding unit and the coating unit are arranged are selected so as to satisfy a condition $D>(3/2-1/n)W$, and wherein the coating and the transferring are performed repeatedly on the substrate.

Further features of the present invention will become apparent from the following description of exemplary embodiments with reference to the attached drawings.

DESCRIPTION OF THE EMBODIMENTS

Embodiments of the present invention are described below with reference to the accompanying drawings.

First Embodiment

Figure 1:
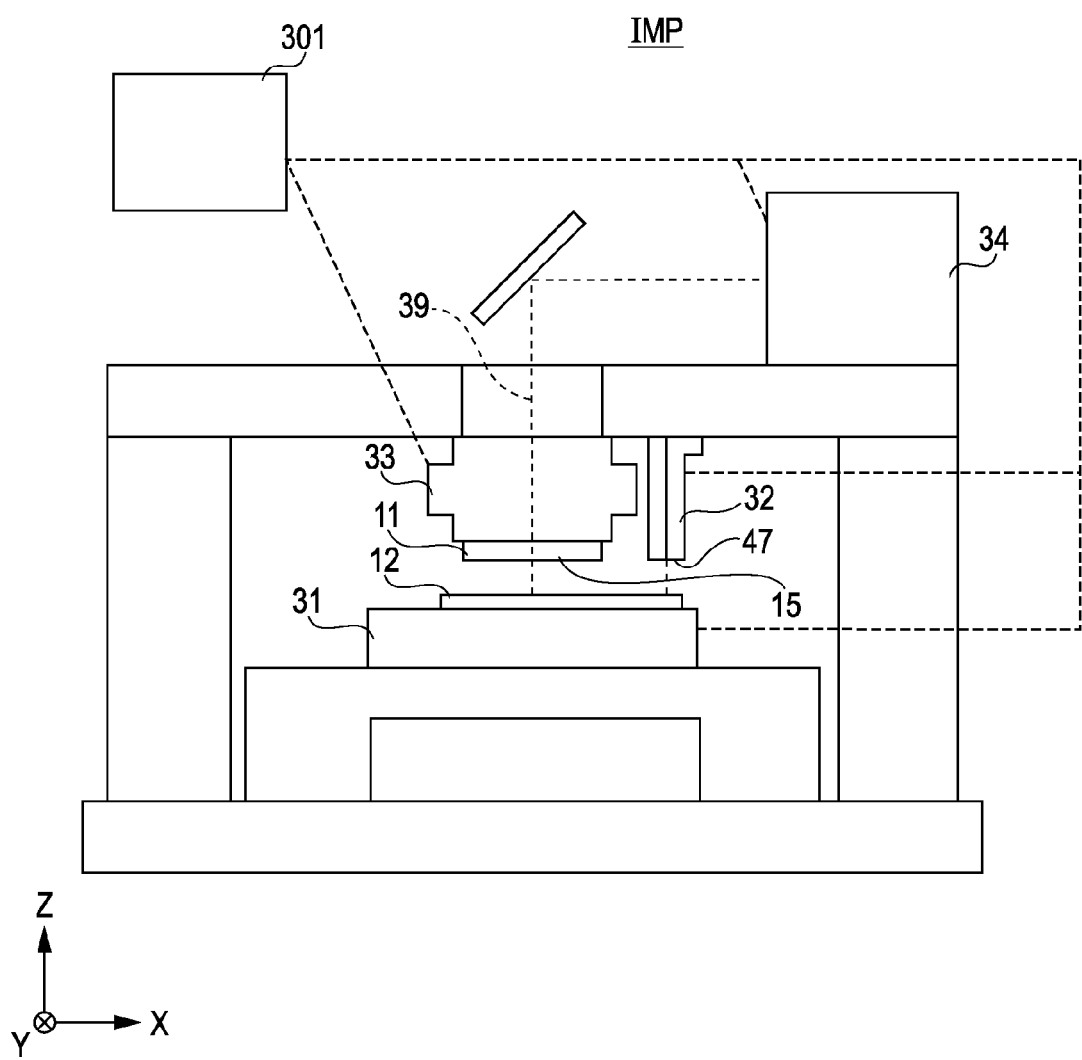
FIG. 1 is a diagram illustrating a structure of an imprinting apparatus according to an embodiment of the present invention.

Referring to FIG. 1, an imprinting apparatus IMP according to an embodiment of the present invention is described below. The imprinting apparatus IMP includes a holding unit (hereinafter, also referred to as an imprint head) 33 configured to hold a mold 11, a control unit 301 that controls the order in which a plurality of shot areas defined on a substrate are to be subjected to an imprinting process, and a coating unit 32 configured to coat resin in the shot areas. The control unit 301 is configured to control, in addition to the imprinting order, the operation of a wafer stage 31, the coating unit 32, the imprint head 33, and a light illumination system 34. The control unit 301 includes a memory for storing particular data such that the data can be referred to as required. In the imprinting apparatus IMP, the wafer stage 31 is configured to hold a wafer used as the substrate 12 by a wafer chuck (not shown), and the light illumination system 34 is configured to emit light 39 such that the resin is illuminated with the light 39 via the mold 11. In the imprinting apparatus IMP shown in FIG. 1, origins of X and Y axes are set at the center of the imprint head 33. The wafer stage 31 can control the position of the wafer 12 at least in two directions along X and Y axes in an XYZ coordinate system. In the present embodiment, the wafer 12 is moved by driving the wafer stage 31.

To coat resin in a particular shot area of the plurality of shot areas defined on the wafer 12, the coating unit 32 ejects resin while controlling the location of the wafer 12 by the wafer stage 31.

The imprint head 33 holds the mold 11 in an exchangeable manner. The imprint head 33 is driven up and down by an actuator (not shown) while holding the mold 11. By driving the imprint head 33 downward by the actuator, it is possible to press the mold 11 against the wafer 12. The mold 11 can be moved away from the wafer 12 by driving the imprint head 33 upward by the actuator.

Figure 2A:
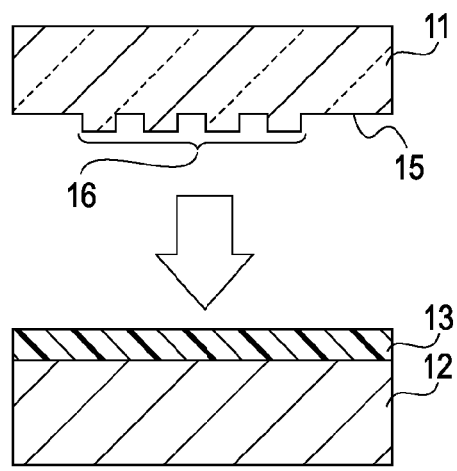
FIG. 2A is a diagram illustrating a method of forming a pattern using a photo curing process.
Figure 2B:
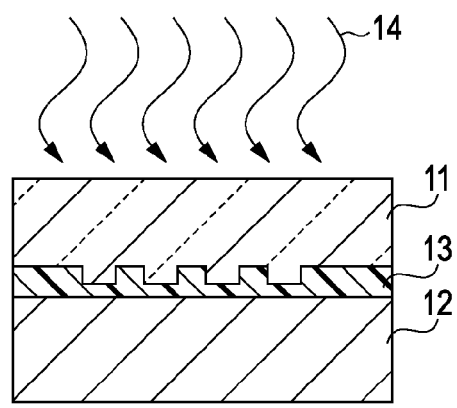
FIG. 2B is a diagram illustrating a method of forming a pattern using a photo curing process.
Figure 2C:
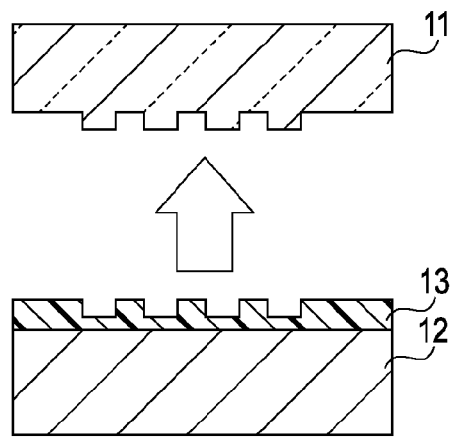
FIG. 2C is a diagram illustrating a method of forming a pattern using a photo curing process.

Referring to FIGS. 2A to 2C, a description is given below of a method of forming a pattern using a photocuring process. First, as shown in FIG. 2A, the mold 11 is pressed against the wafer 12 such that a pattern surface 15 of the mold 11 is in contact with resin 13. In the photocuring method, as for the resin 13, resin is used that is curable when the resin is illuminated with light such as ultraviolet light, and the mold 11 is made of a material such as quartz transparent to light such as ultraviolet light used. The mold 11 has a pattern 16 formed on the pattern surface 15 thereof. When the mold 11 is pressed against the wafer 12, the resin 13 intrudes into depressions of the pattern 16 by capillarity.

Next, as shown in FIG. 2B, while maintaining the state in which the mold 11 is pressed against the resin 13, the resin 13 is illuminated with the ultraviolet light 14 via the mold 11. The illumination of the ultraviolet light 14 causes the resin 13 to cure, and thus the pattern 16 of the mold 11 is transferred to the resin 13 on the wafer 12. Note that pressing the mold 11 against the resin 13 actually refers to pressing the mold 11 against the wafer 12 via the resin 13, and the pattern 16 of the mold 11 does not necessarily need to be in contact with the wafer 12 as shown in FIG. 2B.

Finally, as shown in FIG. 2C, the mold 11 is moved away from the resin 13. After the mold 11 has been moved away, the resin 13 having a shape corresponding to the pattern 16 remains on the wafer 12. The pattern formed in the resin 13 remaining after the mold 11 is moved away is similar to a resist pattern formed by a conventional photolithography process using an exposure apparatus. After that, processing steps may be performed in a similar manner to a semiconductor device production process using an exposure apparatus. In the present description, the term "imprinting" is used to describe the process of forming a pattern on a resin on a substrate by transferring the pattern using the above-described technique.

Figure 3:
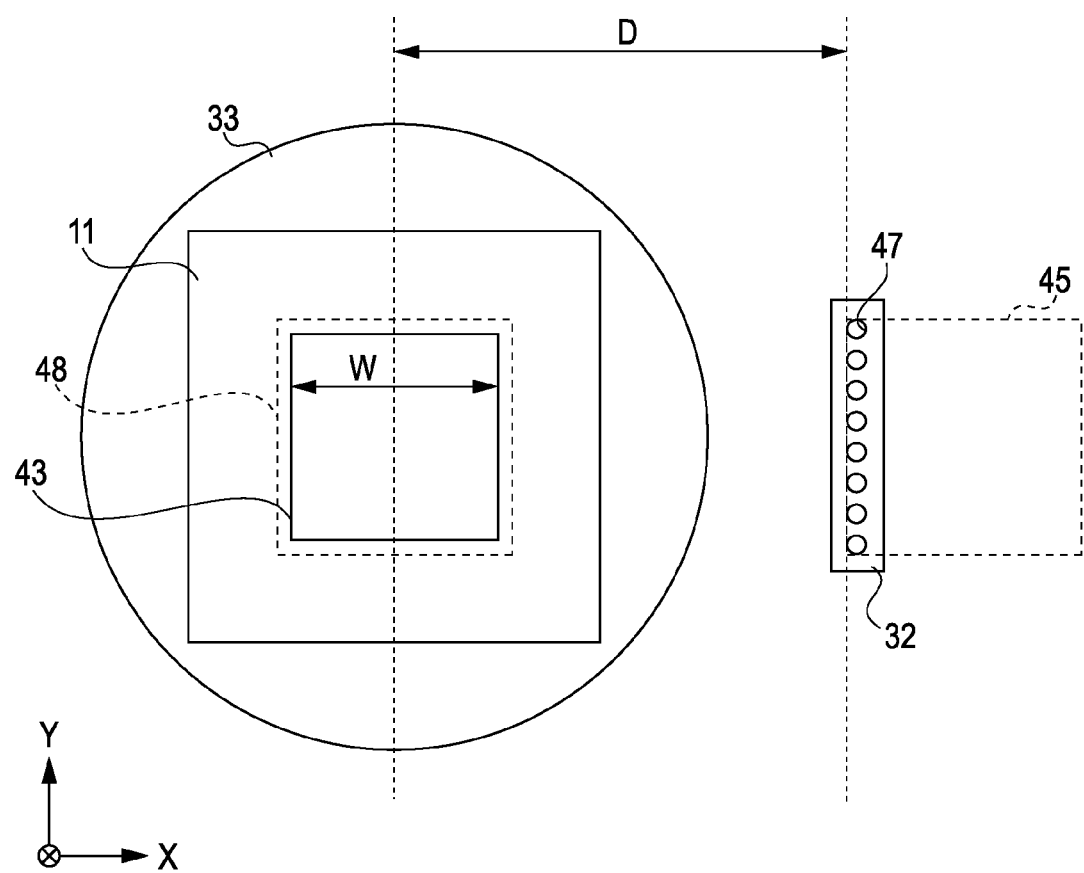
FIG. 3 is a diagram illustrating a positional relationship between a coating unit and a mold according to an embodiment of the present invention.

Next, referring to FIG. 3, a description is given below as to a positional relationship of units of the imprinting apparatus IMP in particular to those involved in the process of coating resin and transferring the pattern. FIG. 3 illustrates the coating unit 32 and the imprint head 33 (shown in FIG. 1) as seen from −Z direction.

The mold 11 has a pattern area 43 in which the pattern is formed. The coating unit 32 is disposed at a location displaced in a +X direction from the center of the imprint head 33 such that no confliction occurs between the driving of the imprint head 33 and the resin ejection by the coating unit 32. The coating unit 32 has a plurality of ejection nozzles 47 arranged in a Y direction. The ejection nozzles 47 may be disposed so as to adapt to the width, as seen in the Y direction, of the shot area. Although the example shown in FIG. 3 includes one line of ejection nozzles 47, there may be disposed a plurality of lines of ejection nozzles 47.

In the imprinting apparatus IMP configured in the above-described manner, in a case where resin is coated on the wafer 12 while moving the wafer 12 in the −X direction, first, the wafer 12 is moved such that a shot area to be processed comes to a coating position 45 at which the coating of resin is started. After that, the resin is ejected from the ejection nozzles 47 while moving the wafer 12 in the −X direction such that the resin is coated in the shot area. Thereafter, to perform transferring of a pattern to the shot area in which the resin has been coated, the wafer 12 is moved such that the shot area with the coated resin comes to a position (transfer position) 48 at which the pattern formed in the Z direction of the pattern area 43 is to be transferred. At this position, the pattern is transferred.

In this description, the distance between the ejection nozzles 47 of the coating unit 32 and the center of the pattern area 43 of the mold 11 is denoted by D. Note that the pattern area 43 refers to an area in which the pattern 16 is formed, and the pattern area 43 corresponds to the shot area on the wafer 12. The width, as seen in the X direction, of the shot area on the wafer corresponding to the pattern area 43 is denoted by W. The coating position 45 and the transfer position 48 may be set such that the coating position 45 is coincident with the pattern area 43 as seen from the Z direction and the transfer position 48 is coincident with the ejection nozzle 47 as seen from the Z direction, and there is no particular restriction on the height in the Z direction.

Figure 4:
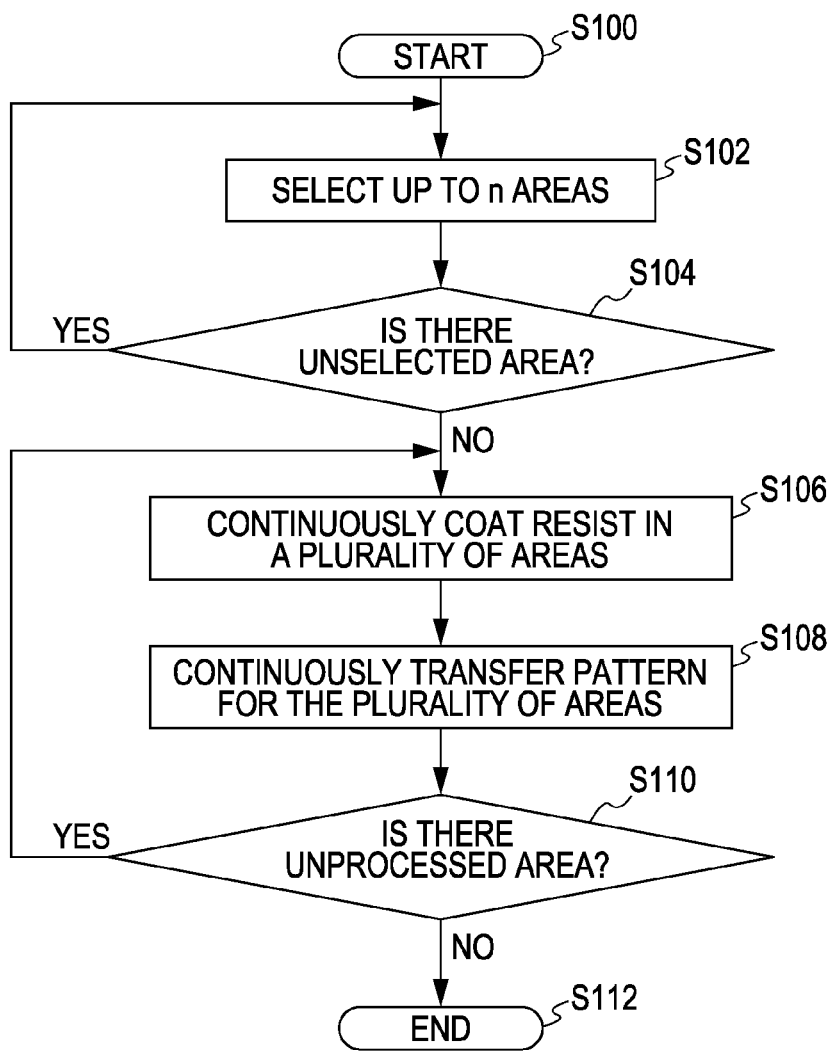
FIG. 4 is a flow chart illustrating a process according to an embodiment of the present invention.

Referring to FIG. 4, an imprinting operation performed by the imprinting apparatus IMP is described below. The processing flow described below is controlled by the control unit 301 of the imprinting apparatus IMP. In the memory of the control unit 301, data is stored in advance as to shot numbers and locations of a plurality of shot areas defined on a wafer. Note that the plurality of shot areas are arranged at regular intervals in X and Y directions. In the following description, series of shot areas in the X directions are referred to as rows, and series of shot areas in the Y directions are referred to as columns.

The imprinting operation is started (in step S100) in a state in which a wafer on which a pattern is to be formed is held on the wafer stage 31 and a mold is held on the mold head.

In step S102, a selection unit in the control unit 301 selects n shot areas in a row from the plurality of shot areas. The shot numbers of the selected shot areas and the set number thereof are stored in the memory of the control unit 301. The set number is a number that identifies the set of shot areas selected in step S102. For example, the set number may be determined starting with 1 and the set number may be incremented by 1 each time step S102 is executed. In step S102, in a case where the number of unselected shot areas in a row of interest is smaller than n, all unselected shot areas are selected, and the shot numbers of the selected shot areas and the set number thereof are stored in the memory of the control unit 301.

Next, in step S104, a determination is made as to whether there is no more unselected shot area in the plurality of shot areas. If there are one or more unselected shot areas, the process in step S102 is performed for the unselected shot areas. The process in step S102 is performed in a similar manner for all rows on the wafer. In a case where there are no unselected shot areas, the processing flow proceeds to step S106.

In step S106, the wafer is moved to the coating position and coating of resin is performed by the coating unit continuously for one set of shot areas indicated by data stored in step S102 in the memory of the control unit 301. If the coating of resin is completed for this set of shot areas, data is added to the data stored in step S102 so as to indicate that the coating of resin is completed for this set of shot areas.

In step S108, the wafer is moved such that a first one of the shot areas that have been subjected to the coating of resin in step S106 comes to the transfer position of the mold, and transferring of the pattern is performed continuously for the shot areas.

In step S110, a determination is made as to whether the coating of resin and the transferring of the pattern in steps S106 and S108 have been performed for all sets of shot areas indicated by data stored in step S102 in the memory of the control unit 301. In a case there is an unprocessed set of shot areas, the unprocessed shot areas are moved to the coating position and then to the transfer position and the processes in step S106 and step S108 are performed.

If there is no unprocessed set of shot areas, the process of coating the resin and transferring the pattern is ended (step S112).

The maximum number, n, of shot areas allowed to be included in one set may be determined, for example, as follows. The maximum number, n, is an integer equal to or greater than 2 and is determined taking into account factors such as the characteristic of the resin, the locations of shot areas defined on the wafer, etc. The resin has a property that the characteristic thereof changes with time after the resin is coated on the wafer 12. Because of this property, if it takes a long time before transferring of the pattern is started after the resin is coated, volatilization can occur in the resin, which can affect the result of the transferring of the pattern. The maximum number n of shot areas allowed to be included in one set may be set so as to limit the time spent before the transferring of the pattern to each shot area is started after the resin is coated in the shot area thereby preventing the influence on the result of the transferring of the pattern.

Figure 5:
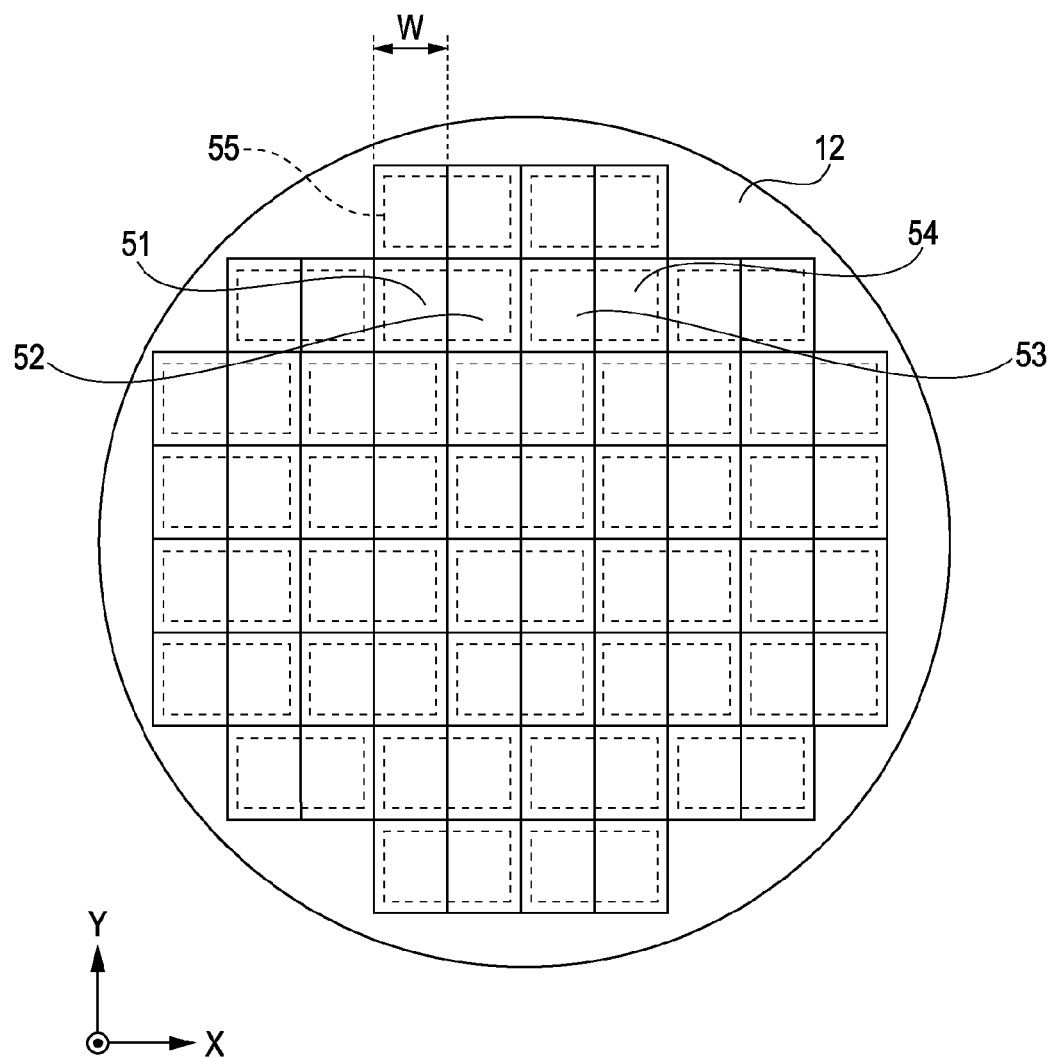
FIG. 5 is a diagram illustrating a manner in which shot areas are selected according to an embodiment of the present invention.

Referring to FIG. 5, a description is given below as to a specific example of a manner in which the selection unit selects n shot areas in step S102. In the example shown in FIG. 5, n is selected to be 2. On the surface of the wafer 12, a plurality of shot areas including shot areas 51, 52, 53, and 54 are defined. In the example shown in FIG. 5, 64 shot areas are defined on the surface of the wafer 12. In FIG. 5, each set of shot areas selected in step S102 is surrounded by a dotted line 55. In the example shown in FIG. 5, a total of 32 sets of shot areas are selected. For example, shot areas 51 and 52 are selected as one set, and shot areas 53 and 54 are selected as another set.

Next, a description is given below as to the process of continuously coating resin and continuously transferring the pattern for a plurality of shot areas in steps S106 and S108. The process is described for the following two cases: (1) coating of resin and transferring of the pattern are performed for the shot areas defined on the wafer in the order in the +X direction; and (2) coating of resin and transferring of the pattern are performed for the shot areas defined on the wafer in the order in the −X direction.

Figure 6:
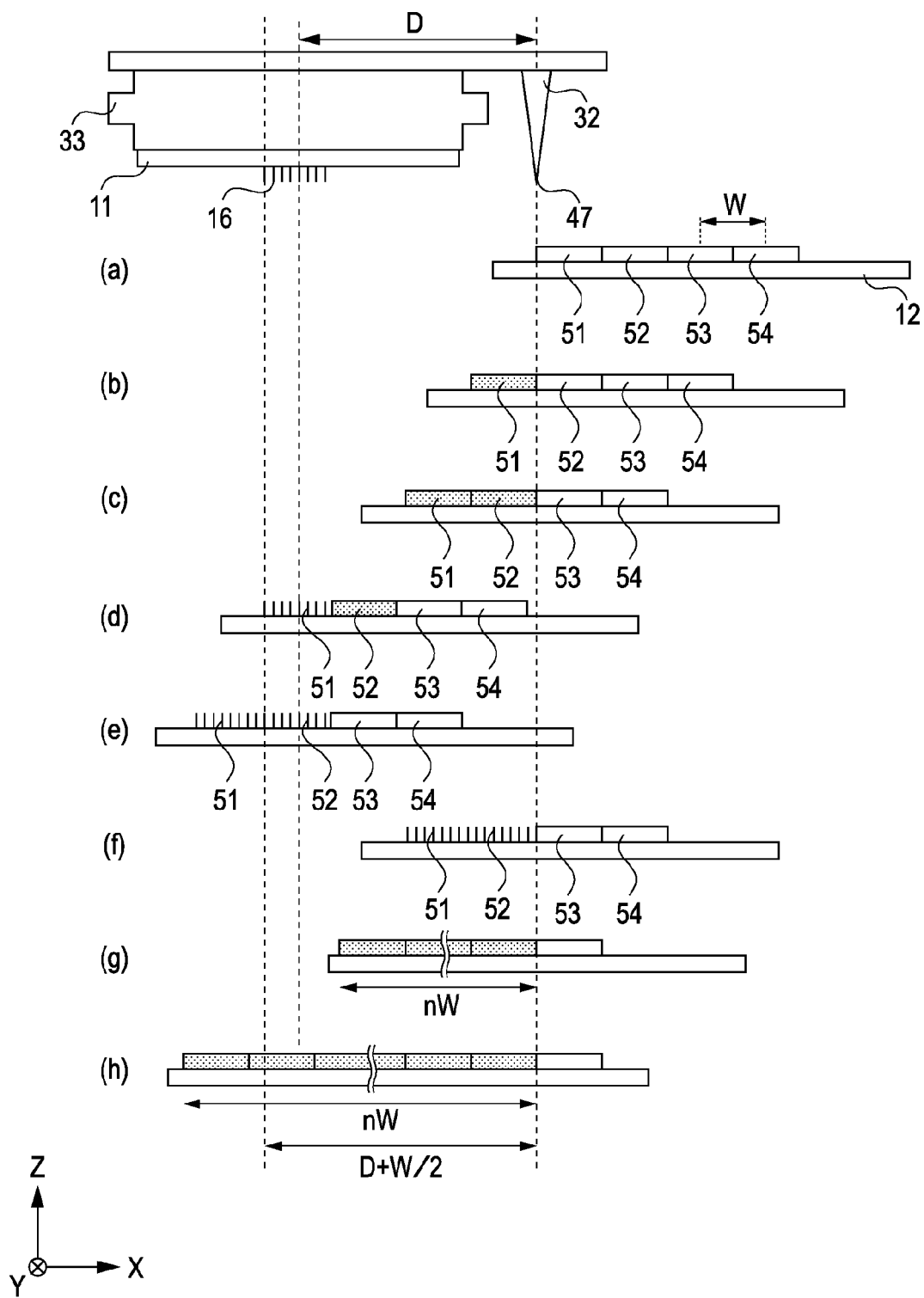
FIG. 6 is a diagram illustrating a process of coating resin and transferring a pattern according to an embodiment of the present invention.

Referring to FIG. 6, the process is described for the case (1) in which coating of resin and transferring of the pattern are performed for shot areas in the order in the +X direction. In the following description, by way of example, the process of coating resin and transferring the pattern is explained only for the set of shot areas 51 and 52 and the set of shot areas 53 and 54 selected in FIG. 5.

In FIG. 6, (a) illustrates a state immediately before starting the coating of the resin in the shot areas 51 and 52 selected in FIG. 5. In this state, the shot area 51 has already been moved to the resin coating position 45 shown in FIG. 3. In this state, the coating of the resin is started. While moving the wafer 12 in the −X direction, the coating unit 32 coats the resin in the shot area 51. In FIG. 6, (b) illustrates a state in which coating of the resin in the shot area 51 has been completed. Following the coating of the resin in the shot area 51, coating of resin is performed for the shot area 52 in a similar manner to the shot area 51. In FIG. 6, (c) illustrates a state in which coating of the resin in the shot area 52 has been completed. After the coating of resin is completed for the set of shot areas 51 and 52, for preparation for transferring of the pattern 16 of the mold 11, the wafer 12 is moved such that the shot area 51 comes to the transfer position 48 (shown in FIG. 3) at which the transferring of the pattern 16 is to be performed. After the wafer 12 is moved, the pattern 16 of the mold 11 is transferred. In FIG. 6, (d) illustrates a state in which the transferring of the pattern 16 to the shot area 51 has been completed. Following the transferring of the pattern 16 to the shot area 51, transferring of the pattern 16 to the shot area 52 is performed. In FIG. 6, (e) illustrates a state in which the transferring of the pattern 16 to the shot area 52 has been completed. After the transferring of the pattern 16 to the set of shot areas 51 and 52 is completed, for preparation of performing coating of the resin for the set of shot areas 53 and 54, the wafer 12 is moved in the +X direction such that the shot area 53 comes to the coating position 45 (shown in FIG. 3) at which to coat resin. In FIG. 6, (f) illustrates a state immediately before starting the coating of the resin for the set of the shot areas 53 and 54. In this state, the process described above with reference to (b) to (e) in FIG. 6 is performed again to coat the resin and transfer the pattern for the set of shot areas 53 and 54. The process described above is repeated until the coating of resin and the transferring of the pattern are performed for all shot areas on the wafer. Note that in the above-described process in which resin is continuously coated for a plurality of shot areas on the wafer and, after the coating of the resin is completed for the plurality of shot areas, the pattern is continuously transferred to the plurality of shot areas, the plurality of shot areas that are subjected continuously at a time to the above process are determined such that the plurality of shot areas are located in one row on the wafer. If the process is performed continuously for a plurality of shot areas that are located in different rows, movement in the Y direction is necessary in addition to the movement in the X direction, which can lead to a reduction in throughput. That is, the process including continuous coating of resin and continuous transferring of the pattern is performed on a row-by-row basis thereby forming the pattern on the wafer.

In the above-described process according to the present embodiment, the wafer is moved during the coating of resin and the transferring of the pattern for n shot areas. The total amount of movement of the wafer can be calculated as follows. In the present embodiment and also other embodiments described below, it is assumed that the width W of each shot area as seen in the X direction is equal to the width, as seen in the X direction, of the pattern area 43 in which the pattern 16 is formed and also equal to the center-to-center distance between two shot areas that are adjacent in the X direction to each other. The wafer is moved by a distance of W as resin is coated over one shot area. Therefore, the wafer is moved by a distance of nW to coat resin over n shot areas. After the coating of resin is completed for n shot areas on the wafer, transferring of the pattern is performed in either one of the two ways described below.

(1-1) In a case where D+W/2>nW (see (g) of FIG. 6) at a location at which the coating of resin is completed for n shot areas and the wafer is going to be moved in the −X direction to the pattern transfer position at which the pattern transferring is to be performed for a first shot area of the set, the amount of movement of the wafer is calculated as follows. In this case, after the coating of resin is completed, the wafer is moved by a distance D+W/2-nW to a location at which the first shot area of the set is just under the pattern of the mold. The wafer is then further moved by a distance of (n−1)W to finish continuous transferring of the pattern for n shot areas. The wafer is then moved by a distance of D−W/2 to the coating position at which to perform coating of resin for a next set of shot areas. Thus, the total amount of movement of the wafer necessary in the coating of resin and transferring of the pattern for n shot areas according to the present embodiment is given equation (1.1) shown below.

$$nW+(D+W/2-nW)+(n-1)W+(D-W/2)=2D-W+nW \quad (1.1)$$

(1-2) On the other hand, in a case where D+W/2>nW at a location at which the coating of resin is completed for n shot areas (see (h) in FIG. 6), and the wafer is going to be moved in the +X direction to the pattern transfer position at which the pattern transferring is to be performed for a first shot area of the set, the amount of movement of the wafer is calculated as follows. In this case, after the coating of resin is completed, the wafer is moved by a distance of nW−D−W/2 to a location at which the first shot area of the set is just under the pattern of the mold. The wafer is then further moved by a distance of (n−1)W to finish continuous transferring of the pattern for n shot areas. The wafer is then moved by a distance of D−W/2 to the coating position at which to perform resin coating for a next set of shot areas. Thus, in this case, the total amount of movement of the wafer necessary in the coating of resin and transferring of the pattern for n shot areas according to the present embodiment is given by equation (1.2) shown below.

$$nW+(nW-D-W/2)+(n-1)W+(D-W/2)=3nW-2W \quad (1.2)$$

Figure 7:
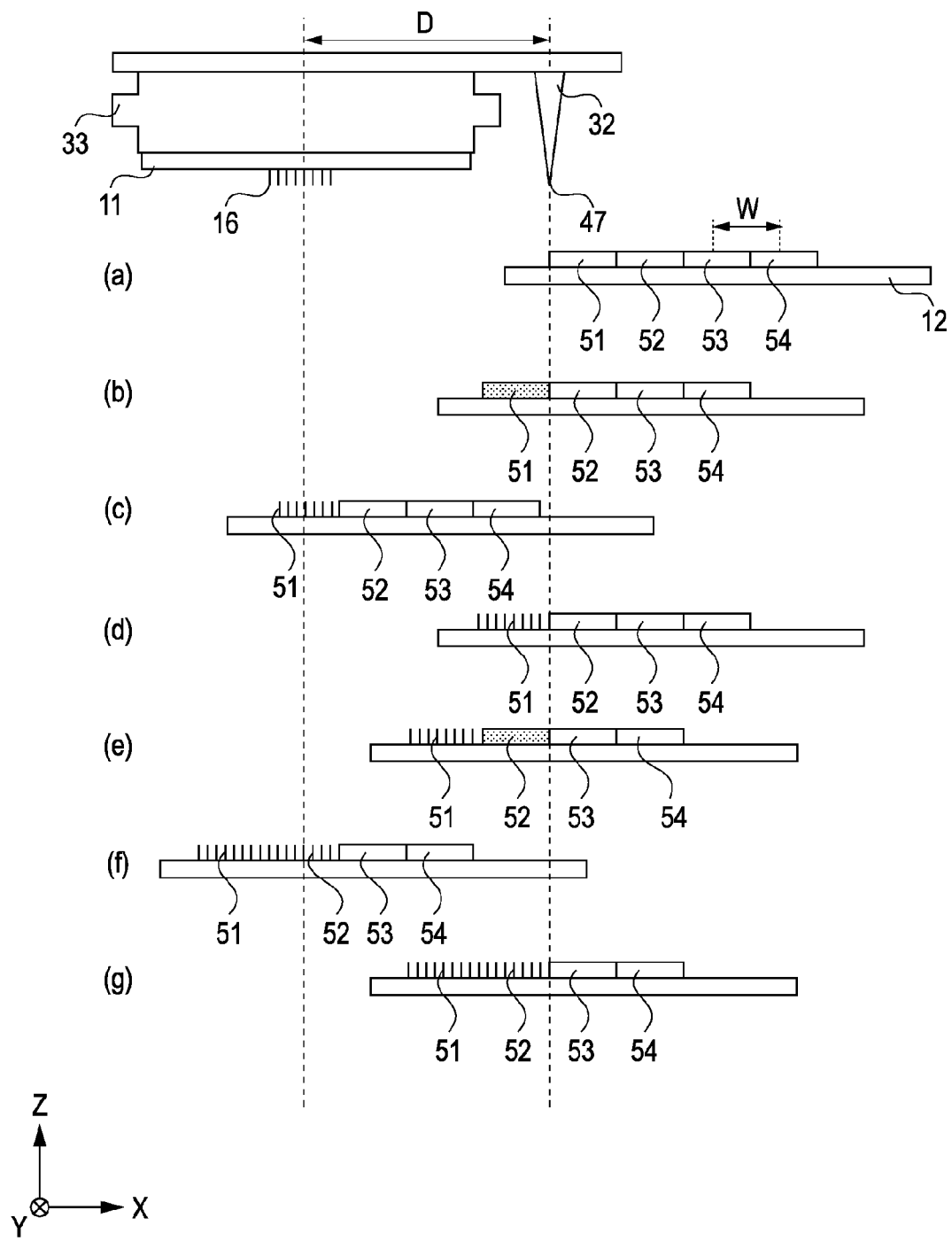
FIG. 7 is a diagram illustrating a process of coating resin and transferring a pattern according to a conventional technique.

For the purpose of comparison, movement of a wafer according to a conventional technique is described below with reference to FIG. 7. In FIG. 7, (a) illustrates a state immediately before starting the coating of resin for a shot area 51. In this state, the coating of the resin is started. In FIG. 7, (b) illustrates a state in which coating of the resin in the shot area 51 has been completed. After the resin coating is completed for the shot area 51, the pattern 16 of the mold 11 is transferred. In FIG. 7 (c) illustrates a state in which the transferring of the pattern 16 to the shot area 51 has been completed. After the pattern transferring is completed for the shot area 51, for preparation of coating of resin for the shot area 52, the wafer is moved in the +X direction. In FIG. 7, (d) illustrates a state immediately before starting the coating of resin for the shot area 52. In FIG. 7, (e) to (g) correspond to (b) to (d) in FIG. 7 and illustrate processing steps of coating resin and transferring the pattern to the shot area 52. Although FIG. 7 illustrates the process only for two shot areas, the process of coating resin and transferring the pattern is performed for all shot areas on the wafer by repeatedly performing the steps shown in (b) to (d) in FIG. 7.

Thus, in this process according to the conventional technique, the total amount of movement of the wafer necessary in the coating of resin and transferring of the pattern for n shot areas can be calculated as follows. The wafer is moved by a distance of W as resin is coated over one shot area. After the coating of resin is completed, the wafer is moved by a distance of D−W/2 such that the shot area is located just under the pattern of the mold. The wafer is then moved by a distance of D−W/2 to the coating position at which to perform coating of resin for a next shot area. Thus, the total amount of movement of the wafer necessary in the coating of resin and transferring of the pattern for n shot areas is given by equation (1.3) shown below.

$$(W+(D-W/2)+(D-W/2))\times n=2nD \quad (1.3)$$

From equations (1.1) and (1.3), it is derived that when the condition given by (1.4) shown below is satisfied, the total amount of movement of the wafer according to the present embodiment of the invention is smaller than that according to the conventional technique.

$$2D-W+nW<2nD$$

$$D>W/2 \quad (1.4)$$

The condition (1.1) described above is premised on the condition D+W/2>nW, and n is assumed to be an integer equal to or greater than 2, and thus D>3W/2. Therefore, the amount of movement of the wafer is always smaller for the present embodiment of the invention.

On the other hand, from equations (1.2) and (1.3), the condition (1.5) shown below can be derived.

$$3nW-2W<2nD$$

$$D>(3/2-1/n)W \quad (1.5)$$

The condition (1.2) described above is premised on the condition D+W/2<nW, and thus in this case, to ensure that the amount of movement of the wafer is smaller for the present embodiment of the invention, it is necessary to determine D and W such that the condition (1.5) is satisfied. By comparison between the condition (1.4) and the condition (1.5), it can be concluded that the condition (1.5) determines the lower limit that allows achievement of the advantages of the present embodiment of the invention.

Figure 8:
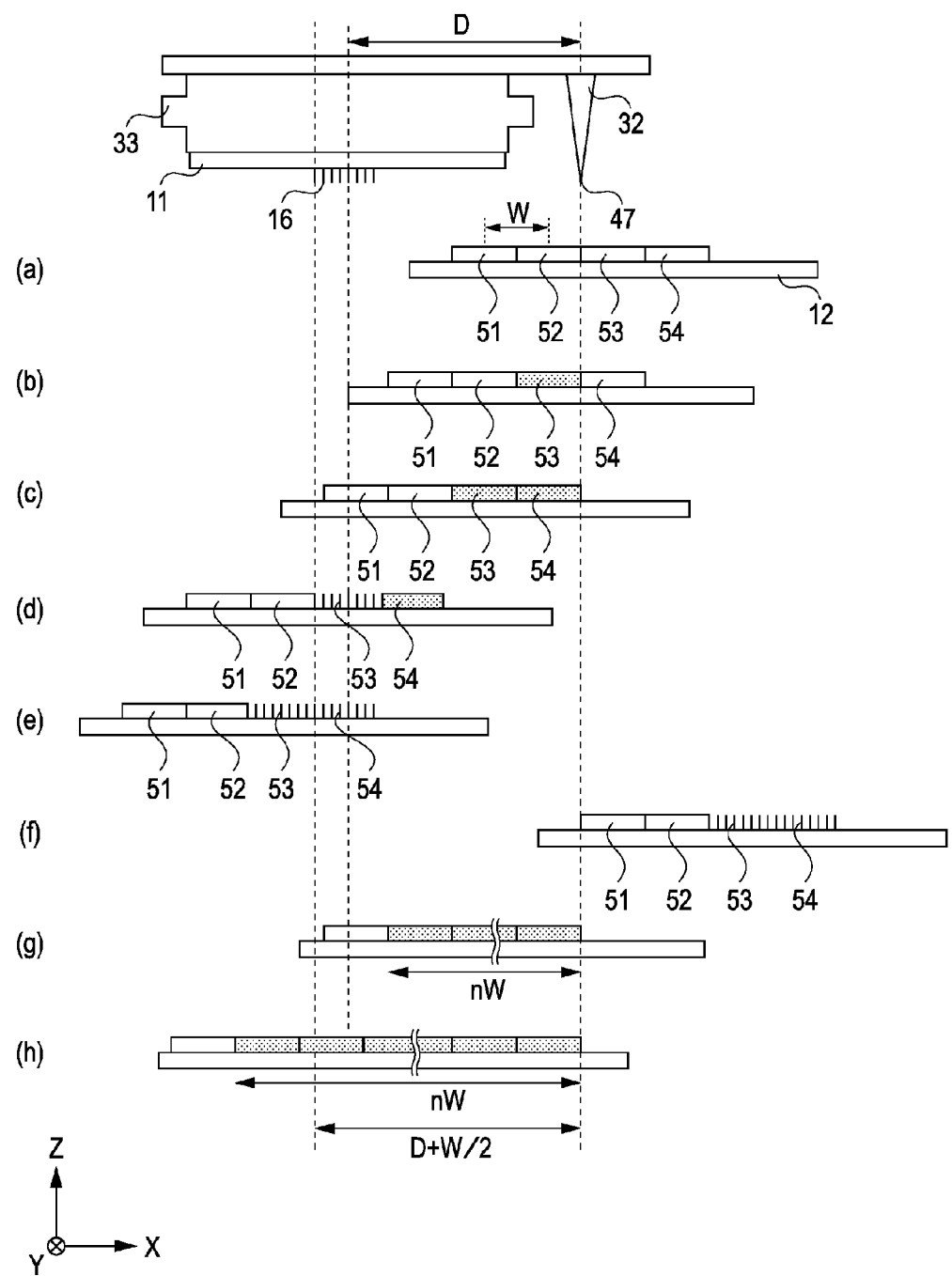
FIG. 8 is a diagram illustrating a process of coating resin and transferring a pattern according to an embodiment of the present invention.
Figure 9:
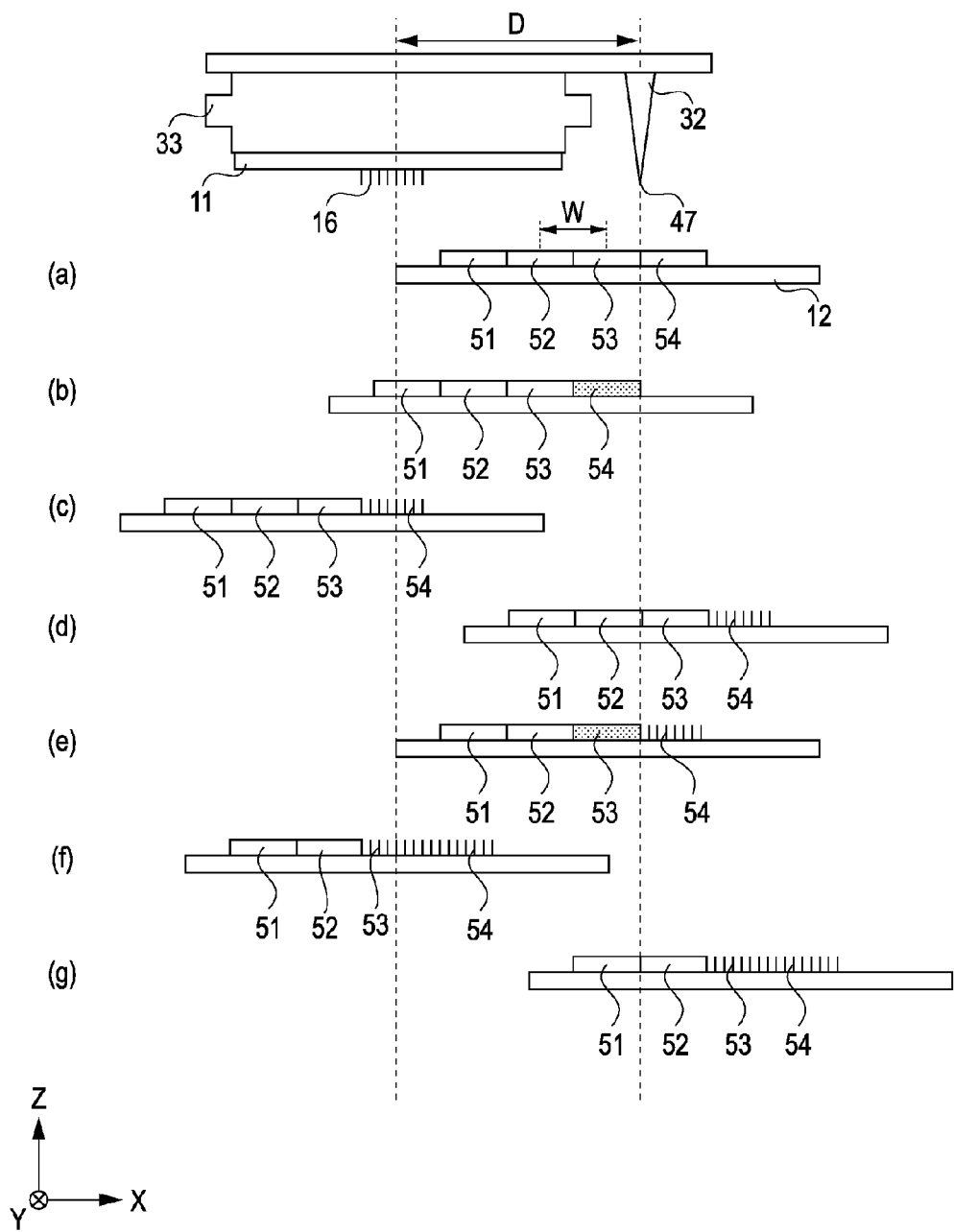
FIG. 9 is a diagram illustrating a process of coating resin and transferring a pattern according to a conventional technique.

Next, referring to FIGS. 8 and 9, the process is described for the case (2) in which coating of resin and transferring of the pattern are performed for shot areas in the order in the −X direction. In the following description, by way of example, the process of coating resin and transferring the pattern is explained only for the set of shot areas 51 and 52 and the set of shot areas 53 and 54 selected in FIG. 5. FIGS. 8 and 9 illustrate movement of a wafer in the process in which coating of resin and transferring of the pattern are performed for shot areas in the order in the −X direction.

In FIG. 8, (a) to (h) correspond to (a) to (h) in FIG. 6. The process shown in FIG. 8 is different from that shown in FIG. 6 in that the process is started with the set of shot areas 53 and 54, and coating of resin and transferring of the pattern are performed for shot areas in the order in the −X direction.

In this case, the total amount of movement of the wafer necessary in the coating of resin and transferring of the pattern continuously for n shot areas can be calculated as follows. The wafer is moved by a distance of W as resin is coated over one shot area. Therefore, the wafer is moved by a distance of nW to coat resin over n shot areas. After the coating of resin is completed for n shot areas on the wafer, transferring of the pattern is performed in either one of the two ways described below.

(2-1) In a case where D+W/2>nW (see (g) of FIG. 8) at a location at which the coating of resin is completed for n shot areas, and the wafer is going to be moved in the −X direction to the pattern transfer position at which the pattern transferring is to be performed for a first shot area of the set, the amount of movement of the wafer is calculated as follows. In this case, after the coating of resin is completed, the wafer is moved by a distance of D+W/2−nW such that the shot area is located just under the pattern of the mold. The wafer is then further moved by a distance of (n−1)W to finish continuous transferring of the pattern for n shot areas. The wafer is then moved by a distance of D−W/2+2nW to the coating position at which to perform coating of resin for a next set of shot areas. Thus, in this case, the total amount of movement of the wafer necessary in the coating of resin and transferring of the pattern for n shot areas according to the present embodiment is given by equation (2.1) shown below.

$$nW+(D+W/2-nW)+(n-1)W+(D-W/2+2nW)=2D-W+3nW \quad (2.1)$$

(2-2) On the other hand, in a case where D+W/2<nW at a location at which the coating of resin is completed for n shot areas (see (h) of FIG. 8), and the wafer is going to be moved in the +X direction to the pattern transfer position at which the pattern transferring is to be performed for a first shot area of the set, the amount of movement of the wafer is calculated as follows. In this case, after the coating of resin is completed, the wafer is moved by a distance of nW−D−W/2 such that the shot area is located just under the pattern of the mold. The wafer is then further moved by a distance of (n−1)W to finish continuous transferring of the pattern for n shot areas. The wafer is then moved by a distance of D−W/2+2nW to the coating position at which to perform coating of resin for a next set of shot areas. Thus, in this case, the total amount of movement of the wafer necessary in the coating of resin and transferring of the pattern for n shot areas according to the present embodiment is given by equation (2.2) shown below.

$$nW+(nW-D-W/2)+(n-1)W+(D-W/2+2nW)=5nW-2W \quad (2.2)$$

For the purpose of comparison, moving of a wafer according to a conventional technique is described below with reference to FIG. 9. In FIG. 9, (a) to (g) correspond to (a) to (g) in FIG. 7. The process shown in FIG. 9 is different from that shown in FIG. 7 in that the process is started with the shot area 54, and coating of resin and transferring of the pattern are performed for shot areas in the order in the −X direction.

Thus, in this process according to the conventional technique, the total amount of movement of the wafer necessary in the coating of resin and transferring of the pattern for n shot areas can be calculated as follows. The wafer is moved by a distance of W as resin is coated over one shot area. After the coating of resin is completed, the wafer is moved by a distance of D−W/2 such that the shot area is located just under the pattern of the mold. The wafer is then moved by a distance of D+3W/2 to the coating position at which to perform coating of resin for a next shot area. Thus, the total amount of movement of the wafer necessary in the coating of resin and transferring of the pattern for n shot areas is given by equation (2.3) shown below.

$$(W+(D-W/2)+(D+3W/2))\times n=2nD+2nW \quad (2.3)$$

From equations (2.1) and (2.3), it is derived that when the condition given by (2.4) shown below is satisfied, the total amount of movement of the wafer according to the present embodiment of the invention is smaller than that according to the conventional technique.

$$2D-W+3nW<2nD+2nW$$

$$D>W/2 \quad (2.4)$$

The condition (2.1) described above is premised on the condition D+W/2>nW, and n is assumed to be an integer equal to or greater than 2, and thus D>3W/2. Therefore, the amount of movement of the wafer is always smaller for the present embodiment of the invention.

On the other hand, from equations (2.2) and (2.3), the condition (2.5) shown below can be derived.

$$5nW-2W<2nD+2nW$$

$$D>(3/2-1/n)W \quad (2.5)$$

The condition (2.2) described above is premised on the condition D+W/2<nW, and thus in this case, to ensure that the amount of movement of the wafer is smaller for the present embodiment of the invention, it is necessary to determine D and W such that the condition (2.5) is satisfied. By comparison between the condition (2.4) and the condition (2.5), it can be concluded that the condition (2.5) determines the lower limit that allows achievement of the advantages of the present embodiment of the invention.

In the steps described above with reference to (b) and (c) in FIG. 6 and (b) and (c) in FIG. 8, the coating of resin for two shot areas is performed on a one-by-one basis. Alternatively, the coating of resin may be performed continuously for two shot areas while continuously moving the wafer without a break. This leads to a reduction in the number of times the wafer stage is accelerated and decelerated, and thus it becomes possible to reduce the time needed to coat resin for two shot areas.

Second Embodiment

Next, a second embodiment of the present invention is described below. In the process of coating resin in two or more adjacent shot areas and transferring a pattern successively for these shot areas, if the process includes illumination of light such as ultraviolet light, scattering of light can occur which might have an influence on adjacent shot area. One of potential influences of scattered light is to cause resin to be cured before the pattern is transferred. Depending on the sensitivity of the resin used, the illumination condition, the space between adjacent shot areas, etc., it is necessary to take into account the influence. When the influence cannot be neglected, the influence can be reduced if the selection unit selects each set of shot areas such that selected shot areas are at locations spaced apart by a predetermined distance. In the following description, s is used to specify the space between selected shot areas. More specifically, in the selection of shot areas, shot areas are selected such that there are (s−1) other shot areas between the selected shot areas. For example, when s=1, the selection unit selects immediately adjacent shot areas. When s=2, the selection unit selects shot areas such that there is one shot area between the selected shot areas. In the process described below according to the present embodiment, n shot areas are selected such that there are (s−1) other shot areas between each two adjacent selected shot areas where s is an integer equal to or greater than 1.

Figure 10:
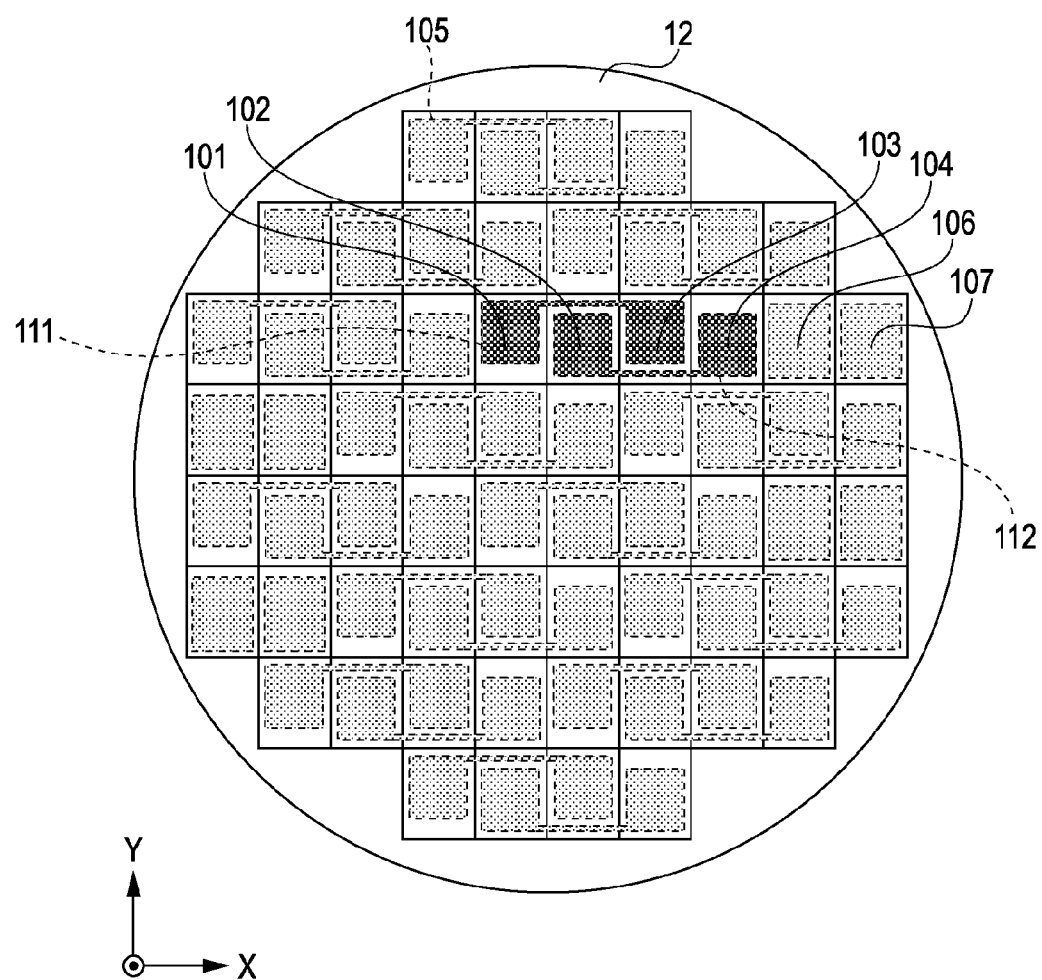
FIG. 10 is a diagram illustrating a manner in which shot areas are selected according to an embodiment of the present invention.

Referring to FIG. 10, an explanation is given as to a manner in which n shot areas are selected in step S102. In the example shown in FIG. 10, parameters are set such that n=2 and s=2. On the surface of the wafer 12, a plurality of shot areas including shot areas 101, 102, 103, 104, 106, and 107 are defined. Reference numeral 105 denotes a set of shot areas selected in step S102. For example, shot areas 101 and 103 are selected as a set 111, and shot areas 102 and 104 are selected as another set 112. In the present embodiment, one or more shot areas belonging to another set are intermediate between selected shot areas of a set. In other words, there is overlap in the location among sets of shot areas. In a case where s=2, overlapping occurs between two sets (for example, between sets 111 and 112). That is, overlapping occurs among s sets of shot areas. Note that shot areas 106 and 107 are exceptional shot areas that do not satisfies the conditions, and for these shot areas 106 and 107, the process of coating resin and transferring the pattern is performed on a one-by-one basis.

The process according to the present embodiment is described below for the following two cases: (1) coating of resin and transferring of the pattern are performed for the shot areas defined on the wafer in the order in the +X direction; and (2) coating of resin and transferring of the pattern are performed for the shot areas defined on the wafer in the order in the −X direction.

Figure 11:
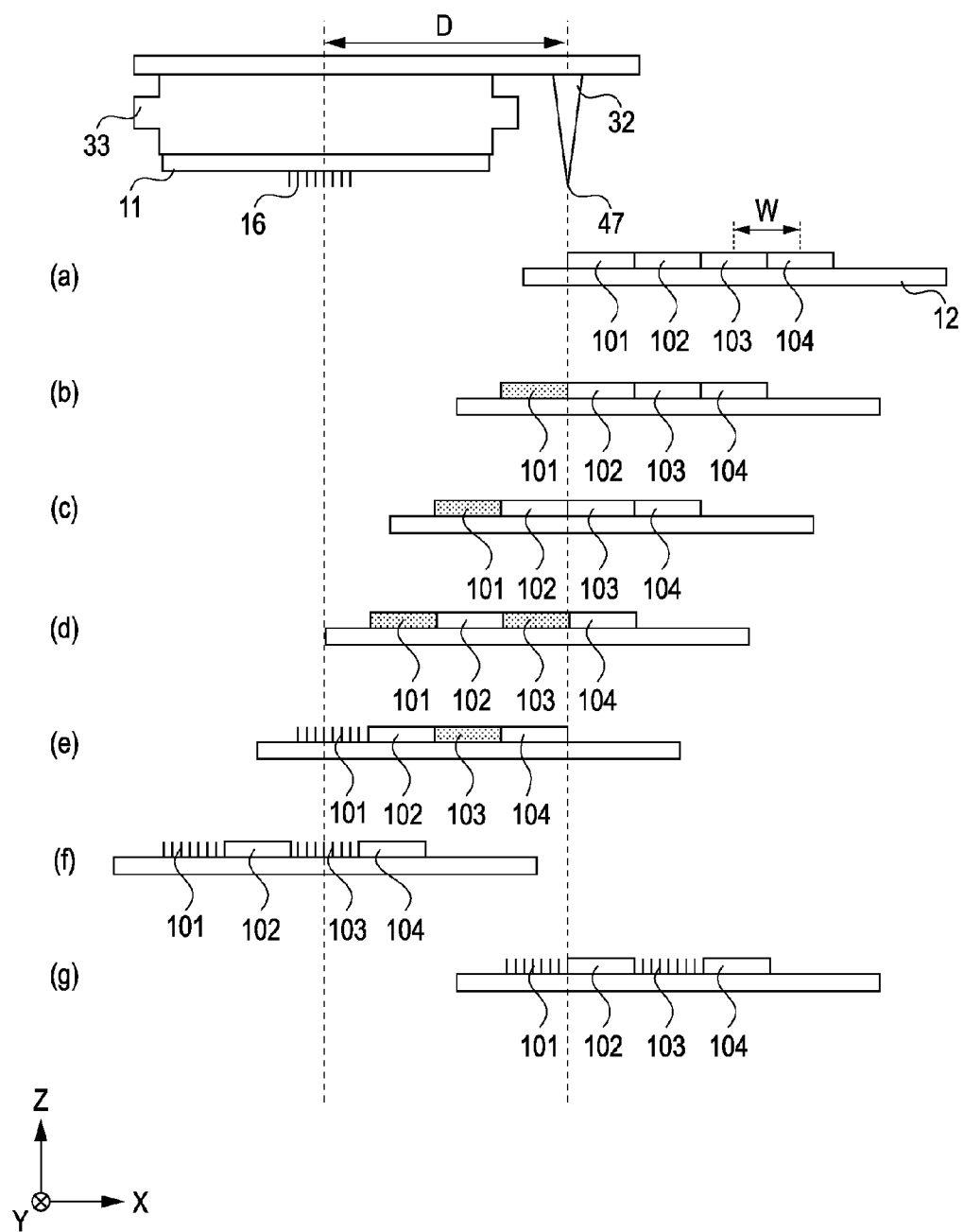
FIG. 11 is a diagram illustrating a process of coating resin and transferring a pattern according to an embodiment of the present invention.

Referring to FIG. 11, the process is described for the case (1) in which coating of resin and transferring of the pattern are performed for shot areas in the order in the +X direction. In the following description, by way of example, the process of coating resin and transferring the pattern is explained only for the set 111 and the set 112 selected in FIG. 10.

In FIG. 11, (a) illustrates a state immediately before starting the coating of resin for the set 111 of shot areas 101 and 103. In FIG. 11, (b) illustrates a state in which coating of resin in the shot area 101 has been completed. In FIG. 11, (c) illustrates a state immediately before starting the coating of resin for a shot area 103 following the coating of the resin for the shot area 101. In FIG. 11, (d) illustrates a state in which coating of resin has been completed for the shot area 103. After the coating of resin is completed for the set 111, transferring of the pattern 16 is performed. In FIG. 11, (e) illustrates a state in which the transferring of the pattern 16 to the shot area 101 has been completed. Following the transferring of the pattern 16 to the shot area 101, transferring of the pattern 16 to the shot area 103 is performed. In FIG. 11, (f) illustrates a state in which the transferring of the pattern 16 to the shot area 103 has been completed. After the transferring of the pattern 16 to the set 111 of shot areas 101 and 103 is completed, the wafer is moved for preparation of coating of resin for the set 112 of shot areas 102 and 104. In FIG. 11, (g) illustrates a state immediately before starting the coating of resin for the set of shot areas 102 and 104. In this state, the process described above with reference to (b) to (f) in FIG. 11 is performed again to coat resin and transfer the pattern for the set 112 of shot areas 102 and 104. The above-described process is performed repeatedly until coating of resin and transferring of the pattern are completed for all shot areas on the wafer.

Next, the amount of movement of the wafer during the process according to the present embodiment is calculated. In the present embodiment, the amount of movement necessary to perform the process for a total of s overlapping sets is calculated, where the process for each set includes continuously coating resin for n shot areas of the set and then transferring the pattern for the n shot areas. The wafer is moved by a distance of W as resin is coated over one shot area. The center-to-center distance between two adjacent shot areas belonging to each set is sW, and thus the amount of movement during the process of coating resin for all n shot areas in each set is (n−1)sW+W. After the coating of resin is completed for n shot areas, transferring of the pattern is performed in either one of the two ways described below.

(1-1) In a case where D+W/2>(n−1)sW+W at a location at which the coating of resin is completed for n shot areas, and the wafer is going to be moved in the −X direction to the pattern transfer position at which the pattern transferring is to be performed for a first shot area of the set, the amount of movement of the wafer is calculated as follows. In this case, after the coating of resin is completed, the wafer is moved by a distance D+W/2−(n−1)sW−W to a location at which the first shot area of the set is just under the pattern of the mold. The wafer is then further moved by a distance of (n−1)sW to finish continuous transferring of the pattern for n shot areas. The wafer is then moved by a distance of (n−1)sW+(D−W/2) to the coating position at which to perform resin coating for a next set of shot areas. Note that after the process is completed for s sets, this value is given by D−W/2. Thus, the total amount of movement of the wafer necessary in the coating of resin and transferring of the pattern for s sets each including n shot areas according to the present embodiment is given by equation (3.1) shown below.

$$((n-1)sW+W+D+W/2-(n-1)sW-W+(n-1)sW)\times s+((n-1)sW+(D-W/2))(s-1)+D-W/2=(n-1)(2s-1)sW+2sD \quad (3.1)$$

(1-2) On the other hand, in a case where D+W/2<(n−1)sW+W at a location at which the coating of resin is completed for n shot areas, and the wafer is going to be moved in the +X direction to the pattern transfer position at which the pattern transferring is to be performed for a first shot area of the set, the amount of movement of the wafer is calculated as follows. In this case, after the coating of resin is completed, the wafer is moved by a distance (n−1)sW+W−D−W/2 to a location at which the first shot area of the set is just under the pattern of the mold. The wafer is then further moved by a distance of (n−1)sW to finish continuous transferring of the pattern for n shot areas. The wafer is then moved by a distance of (n−1)sW+(D−W/2) to the coating position at which to perform resin coating for a next set of shot areas. Note that after the process is completed for s sets, this value is given by D−W/2. Thus, the total amount of movement of the wafer necessary in the coating of resin and transferring of the pattern for s sets each including n shot areas according to the present embodiment is given by equation (3.2) shown below.

$$((n-1)sW+W+(n-1)sW+W-D-W/2+(n-1)sW)\times s+((n-1)sW+(D-W/2))(s-1)+D-W/2=(4ns-4s-n+2)sW \quad (3.2)$$

For the purpose of comparison, the amount of movement of a wafer in coating resin and transferring a pattern for s sets each including n shot areas according to the conventional technique is calculated below. In the conventional technique, the process of coating resin and transferring the pattern is performed for the total of n×s shot areas on a one-by-one basis. The amount of movement can be determined by substituting ns into n in equation (1.3) according to the first embodiment described above with reference to FIG. 7, and the result is given below.

$$2nsD \quad (3.3)$$

From equations (3.1) and (3.3), it is derived that when the condition given by (3.4) shown below is satisfied, the total amount of movement of the wafer according to the present embodiment of the invention is smaller than that according to the conventional technique.

$$(n-1)(2s-1)sW+2sD<2nsD$$

$$D>(s-1/2)W \quad (3.4)$$

The condition (3.4) described above is premised on the condition $D+W/2>(n-1)sW+W$, and in this case, to ensure that the amount of movement of the wafer is smaller for the present embodiment of the invention, it is necessary to determine D and W such that the condition (3.4) is satisfied.

On the other hand, from equations (3.2) and (3.3), the condition (3.5) shown below can be derived.

$$(4ns-4s-n+2)sW<2nsD$$

$$D>(2s-2s/n-1/2+1/n)W \quad (3.5)$$

The condition (3.5) described above is premised on the condition $D+W/2<(n-1)sW+W$, and in this case, to ensure that the amount of movement of the wafer is smaller for the present embodiment of the invention, it is necessary to determine D and W such that the condition (3.5) is satisfied. That is, inequalities (3.4) and (3.5) indicate conditions that need to be satisfied to achieve the advantages of the present embodiment.

The values of the parameters n and s are determined taking into account factors such as the locations of shot areas, the width W of each shot area, the characteristic of the resin, etc. By determining the values of n and s such that the condition (3.4) or (3.5) is satisfied, the advantages of the present embodiment of the invention can be achieved. In other words, when n and s are given, if checking is performed as to whether the condition (3.4) or (3.5) is satisfied, it is possible to determine whether the advantages of the present embodiment are achieved.

Figure 12:
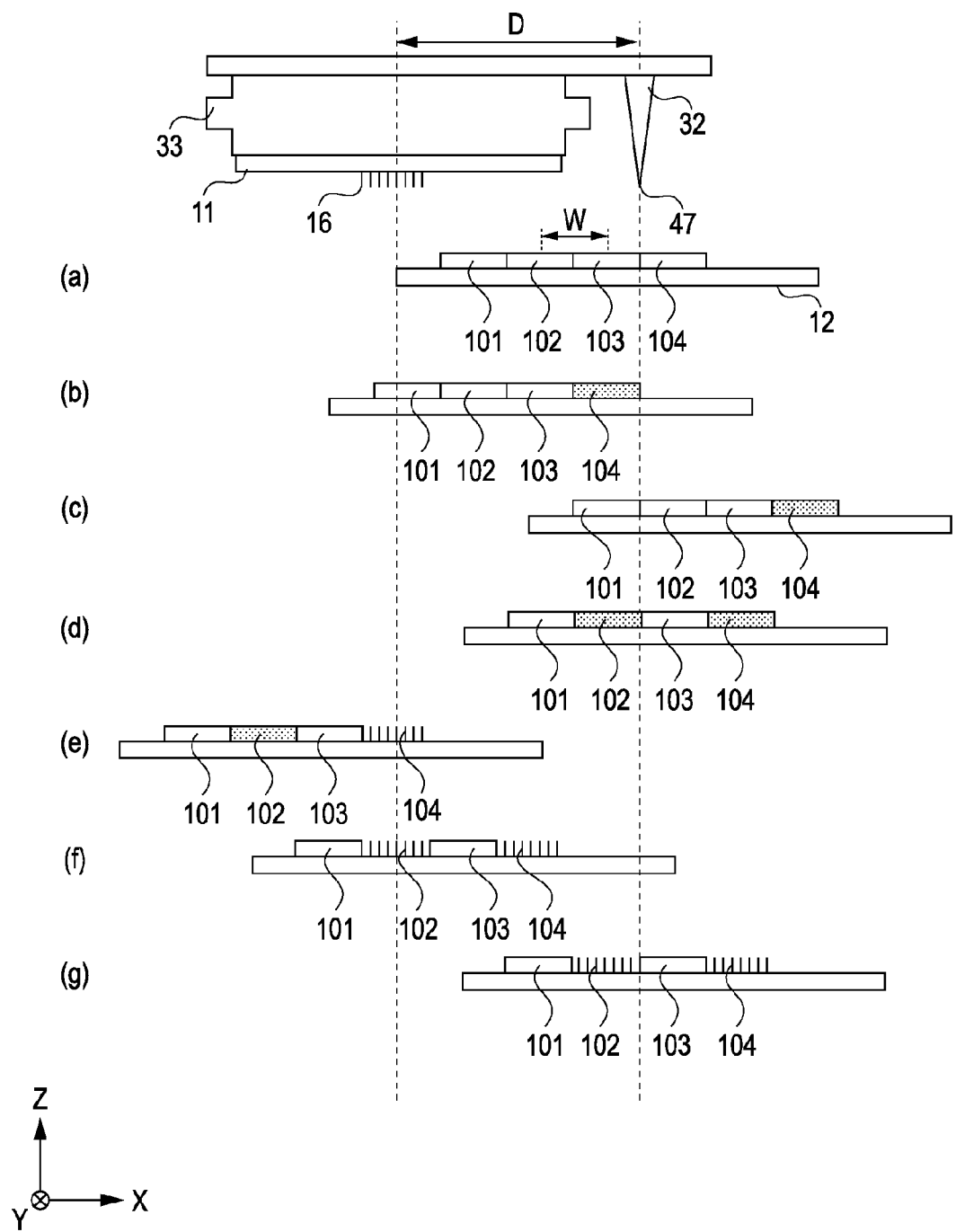
FIG. 12 is a diagram illustrating a process of coating resin and transferring a pattern according to an embodiment of the present invention.

(2) Referring to FIG. 12, the process is described for the case (1) in which coating of resin and transferring of the pattern are performed for shot areas in the order in the –X direction. In the following description, by way of example, the process of coating resin and transferring the pattern is explained only for the set 111 of shot areas 101 and 103 and the set 112 of shot areas 102 and 104 selected in FIG. 10.

In FIG. 12, (a) to (g) correspond to (a) to (g) in FIG. 11. The process shown in FIG. 12 is different from that shown in FIG. 11 in that the process is started with the set of shot areas 102 and 104, and coating of resin and transferring of the pattern are performed for shot areas in the order in the –X direction.

The amount of movement of the wafer during the process can be calculated as follows. In the present embodiment, the amount of movement necessary to perform the process for a total of s overlapping sets is calculated, where the process for each set includes continuously coating resin for n shot areas of the set and then transferring the pattern for the n shot areas. The wafer is moved by a distance of W as resin is coated over one shot area. The center-to-center distance between selected two adjacent shot areas is sW, and thus the amount of movement during the process of coating resin for all n shot areas in each set is $W+(n-1)(sW+2W)$.

In this case, after the coating of resin is completed, the wafer is moved by a distance of $D+W/2+(n-1)sW-W$ to a location at which the first shot area of the set is just under the pattern of the mold. The wafer is then further moved by a distance of $(n-1)sW$ to finish continuous transferring of the pattern for n shot areas. After the transferring of the pattern is completed for n shot areas, coating of resin is performed in either one of the two ways described below.

(2-1) In a case where $D+W/2>(n-1)sW-W$ at a location at which the transferring of the pattern is completed for n shot areas, and the wafer is going to be moved in the +X direction to a location at which coating of resin is to be performed for a next set of shot areas, the amount of movement of the wafer is calculated as follows. After the transferring of the pattern is completed, the wafer is moved by a distance of $D+W/2-(n-1)sW+W$ to a location at which to start coating of resin for the next set of shot areas. Note that in a case where the process is completed for s sets, this distance is given by $D+3W/2$. Thus, the total amount of movement of the wafer necessary in the coating of resin and transferring of the pattern for s sets each including n shot areas according to the present embodiment is given by equation (4.1) shown below.

$$(W+(n-1)(sW+2W)+D+W/2+(n-1)sW-W+(n-1)sW) \times$$
$$s+(D+W/2-(n-1)sW+W)(s-1)+(D+3W/2)=(n-1)$$
$$(2s-1)sW+2sD+2sW(2n-1) \quad (4.1)$$

(2-2) On the other hand, in a case where $D+W/2<(n-1)sW-W$ at a location at which the transferring of the pattern is completed for n shot areas, and the wafer is going to be moved in the –X direction to a location at which coating of resin is to be performed for a next set of shot areas, the amount of movement of the wafer is calculated as follows. After the transferring of the pattern is completed, the wafer is moved by a distance of $(n-1)sW-W-D-W/2$ to a location at which to start coating of resin for the next set of shot areas. Note that in a case where the process is completed for s sets, this distance is given by $D+3W/2$. Thus, the total amount of movement of the wafer necessary in the coating of resin and transferring of the pattern for s sets each including n shot areas according to the present embodiment is given by equation (4.2) shown below.

$$(W+(n-1)(sW+2W)+D+W/2+(n-1)sW-W+(n-1)sW) \times$$
$$s+((n-1)sW-W-D-W/2)(s-1)+(D+3W/2)=(n-1)$$
$$(4s+1)sW-sW+3W+2D \quad (4.2)$$

For the purpose of comparison, the amount of movement of a wafer in coating resin and transferring a pattern for s sets each including n shot areas according to the conventional technique is calculated below. In the conventional technique, the process of coating resin and transferring the pattern is performed for the total of n×s shot areas on a one-by-one basis. The amount of movement can be determined by substituting ns into n in equation (2.3) according to the second embodiment described above with reference to FIG. 9, and the result is given below.

$$2nsD+2nsW \quad (4.3)$$

From equations (4.1) and (4.3), it is derived that when the condition given by (4.4) shown below is satisfied, the total amount of movement of the wafer according to the present embodiment of the invention is smaller than that according to the conventional technique.

$$(n-1)(2s-1)sW+2sD+2sW(2n-1)<2nsD+2nsW$$

$$D>(s+1/2)W \quad (4.4)$$

The condition (4.4) described above is premised on the condition $D+W/2>(n-1)sW-W$, and in this case, to ensure that the amount of movement of the wafer is smaller for the present embodiment of the invention, it is necessary to determine D and W such that the condition (4.4) is satisfied.

On the other hand, from equations (4.2) and (4.3), the condition (4.5) shown below can be derived.

$$(n-1)(4s+1)sW-sW+3W+2D<2nsD+2nsW$$

$$D>(2s-1/2-((2s+1)(s-1))/(ns-1))W \quad (4.5)$$

The condition (4.5) described above is premised on the condition $D+W/2<(n-1)sW-W$, and in this case, to ensure that the amount of movement of the wafer is smaller for the present embodiment of the invention, it is necessary to determine D and W such that the condition (4.5) is satisfied. That is, inequalities (4.4) and (4.5) indicate conditions that need to be satisfied to achieve the advantages of the present embodiment.

The values of the parameters n and s are determined taking into account factors such as the locations of shot areas, the width W of each shot area, the characteristic of the resin, etc. By determining the values of n and s such that the condition (4.4) or (4.5) is satisfied, the advantages of the present embodiment of the invention can be achieved. In other words, when n and s are given, if checking is performed as to whether the condition (4.4) or (4.5) is satisfied, it is possible to determine whether the advantages of the present embodiment are achieved.

Third Embodiment

In the case (2) in the first embodiment described above, the coating of resin and the transferring of the pattern are performed for shot areas in the order in the −X direction, and the wafer is moved in the −X direction during the coating of resin. In a third embodiment described below, instead of coating resin while moving the wafer into the −X direction, coating of resin is performed while moving the wafer in the +X direction.

Figure 13:
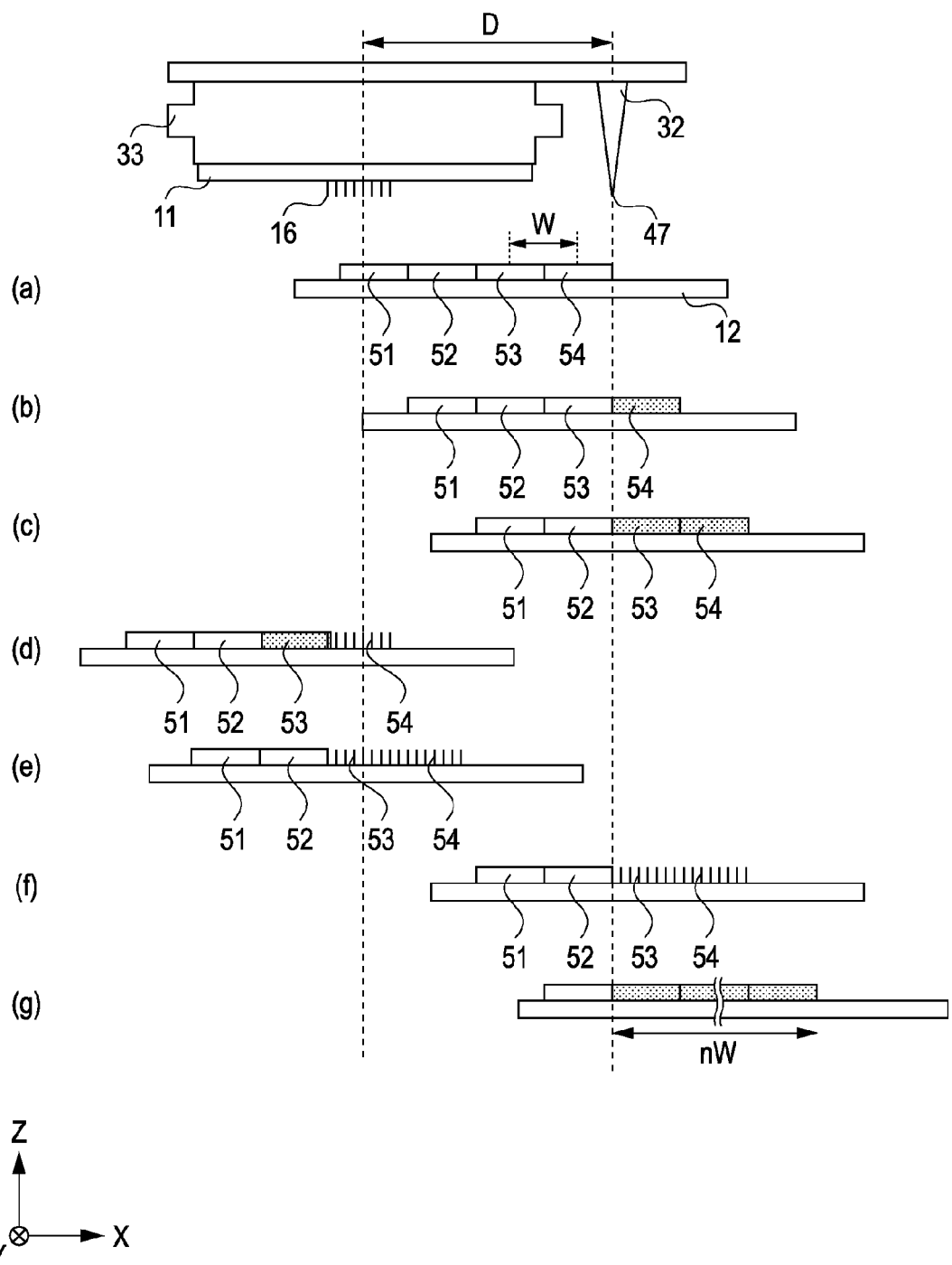
FIG. 13 is a diagram illustrating a process of coating resin and transferring a pattern according to an embodiment of the present invention.

In FIG. 13, (a) to (f) correspond to (a) to (f) in FIG. 8. In the example of the process described below with reference to FIG. 13, coating of resin is performed continuously for a set of shot areas 53 and 54 as with the case shown in FIG. 8. However, the process shown in FIG. 13 is different from that shown in FIG. 8 in that the wafer is moved in the +X direction in the process of coating resin, and thus shot areas are subjected to coating of resin in the order starting with the shot area 54. To coat resin while moving the wafer in the +X direction, the shot area 54 is moved to a location different from the coating position 45 shown in FIG. 3. That is, in the present embodiment, the coating position is located on the −X side of the set of ejection nozzles 47.

In this case, the total amount of movement of the wafer necessary in the coating of resin and transferring of the pattern continuously for n shot areas can be calculated as follows. The wafer is moved by a distance of W to coat resin over one entire shot area. Therefore, the wafer is moved by a distance of nW to coat resin for all n shot areas. In the case (2) according to the first embodiment described above, after the coating of resin is completed for n shot areas, the following process is performed differently depending on the case. However, in the present embodiment, the process is performed always in the same way.

After the coating of resin is completed, the wafer is moved by a distance of D+nW−W/2 to a location at which the first shot area of the set is just under the pattern of the mold. The wafer is then further moved by a distance of (n−1)W to finish continuous transferring of the pattern for n shot areas. The wafer is then moved by a distance of D+W/2 to the coating position at which to perform coating of resin for a next set of shot areas. Thus, in this case, the total amount of movement of the wafer necessary in the coating of resin and transferring of the pattern for n shot areas according to the present embodiment is given by equation (5.1) shown below.

$$(nW+(D+nW-W/2)+(n-1)W+(D+W/2)=2D-W+3nW \quad (5.1)$$

Next, for the purpose of comparison, the amount of movement of a wafer according to the conventional technique is calculated. The wafer is moved in a similar manner to the case (2) according to the first embodiment described above with reference to FIG. 9 except that the wafer is moved in the +X direction during the coating of resin for any shot area. Thus, the total amount of movement of the wafer necessary in the coating of resin and transferring of the pattern for n shot areas can be calculated as follows. The wafer is moved by a distance of W to coat resin over one entire shot area. After the coating of resin is completed, the wafer is moved by a distance of D+W/2 to a location at which that the shot area is just under the pattern of the mold. The wafer is then moved by a distance of D+W/2 to coat resin over the entire next shot area. Thus, the total amount of movement of the wafer necessary in the coating of resin and transferring of the pattern for n shot areas is given by equation (5.2) shown below.

$$(W+(D+W/2)+(D+W/2))\times n=2nD+2nW \quad (5.2)$$

Equation (5.1) is identical to equation (2.1) for the case (2) according to the first embodiment described above, and equation (5.2) is identical to equation (2.3) for the case (2) according to the first embodiment. Therefore, the amount of movement of the wafer is smaller for the present embodiment than the conventional technique when condition (2.4) determined from equations (2.1) and (2.3) is satisfied.

As described above, in the present embodiment, the coating of resin and the transferring of the pattern are performed for shot areas in the order in the −X direction, and the wafer is moved in the +X direction during the coating of resin. In this case, the amount of movement of the wafer is smaller for the present embodiment of the invention than the conventional technique when D and W are selected so as to satisfy condition (2.4).

Fourth Embodiment

In the case (2) in the second embodiment described above, the coating of resin and the transferring of the pattern are performed for shot areas in the order in the −X direction, and the wafer is moved in the −X direction during the coating of resin. In a fourth embodiment described below, instead of coating resin while moving the wafer into the −X direction, coating of resin is performed while moving the wafer in the +X direction.

Figure 14:
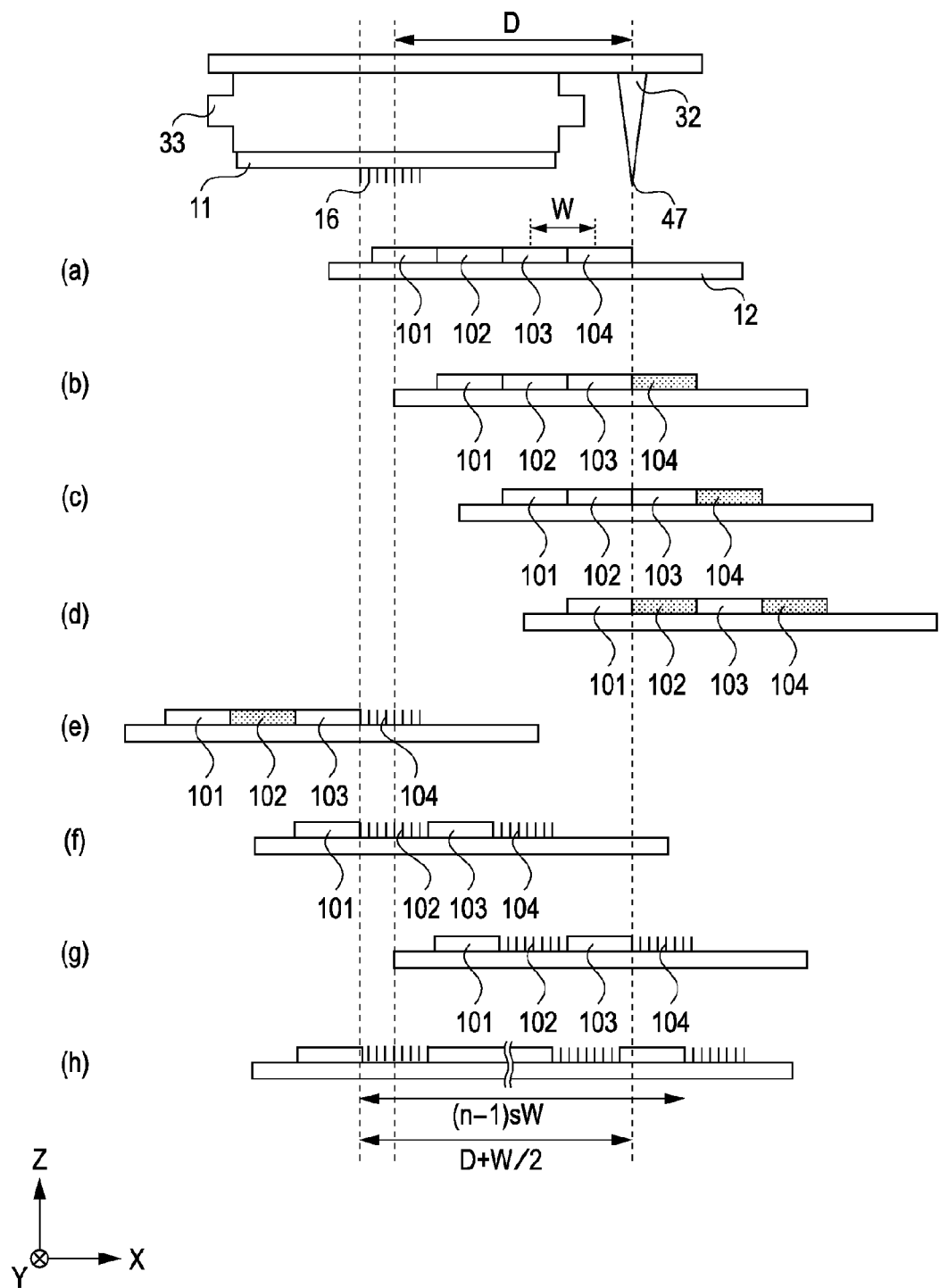
FIG. 14 is a diagram illustrating a process of coating resin and transferring a pattern according to an embodiment of the present invention.

In FIG. 14, (a) to (g) correspond to (a) to (g) of FIG. 12. In the example of the process described below with reference to FIG. 14, coating of resin is performed continuously for a set of shot areas 102 and 104 as with the case shown in FIG. 12. However, the process shown in FIG. 14 is different from that shown in FIG. 12 in that the wafer is moved in the +X direction during the process of coating resin, and thus shot areas are subjected to coating of resin in the order starting with the shot area 54. To coat resin while moving the wafer in the +X direction, the shot area 54 is moved to a location different from the coating position 45 shown in FIG. 3. in the present embodiment, the coating position is located on the −X side of the set of ejection nozzles 47.

In this embodiment, the amount of movement of the wafer during the process can be calculated as follows. The wafer is moved by a distance of W as resin is coated over one shot area. The center-to-center distance between selected two adjacent shot areas is sW, and thus the amount of movement during the process of coating resin for all n shot areas is W+(n−1)sW. After the coating of resin is completed, the wafer is moved by a distance of D+W/2+(n−1)sW to a location at which the shot area is just under the pattern of the mold. The wafer is then further moved by a distance of (n−1)sW to finish continuous transferring of the pattern for n shot areas. After the transferring of the pattern is completed for n shot areas, transferring of the pattern is performed in either one of the two ways described below.

(1) In a case where $D+W/2>(n-1)sW$ at a location at which the transferring of the pattern is completed for n shot areas, and the wafer is going to be moved in the +X direction to a location at which coating of resin is to be started for a next set of shot areas, the amount of movement of the wafer is calculated as follows. After the transferring of the pattern is completed, the wafer is moved by a distance of $D+W/2-(n-1)sW$ to a location at which to start coating of resin for a next set of shot areas. Note that in a case where the process is completed for s sets, this distance is given by $D+W/2$. Thus, the total amount of movement of the wafer necessary in the coating of resin and transferring of the pattern for s sets each including n shot areas according to the present embodiment is given by equation (6.1) shown below.

$$(W+(n-1)sW+D+W/2+(n-1)sW+(n-1)sW)\times s+(D+W/2-(n-1)sW)(s-1)+(D+W/2)=(n-1)(2s+1)sW+2sD+2sW \quad (6.1)$$

(2) In a case where $D+W/2<(n-1)sW$ at a location at which the transferring of the pattern is completed for n shot areas, and the wafer is going to be moved in the −X direction to a location at which coating of resin is to be started for a next set of shot areas (see (h) of FIG. 14), the amount of movement of the wafer is calculated as follows. After the transferring of the pattern is completed, the wafer is moved by a distance of $(n-1)sW-D-W/2$ to a location at which to start coating of resin for a next set of shot areas. Note that in a case where the process is completed for s sets, this distance is given by $D+W/2$. Thus, the total amount of movement of the wafer necessary in the coating of resin and transferring of the pattern for s sets each including n shot areas according to the present embodiment is given by equation (6.2) shown below.

$$(W+(n-1)sW+D+W/2+(n-1)sW+(n-1)sW)\times s+((n-1)sW-D-W/2)(s-1)+(D+W/2)=(n-1)(4s-1)sW+sW+W+2D \quad (6.2)$$

For the purpose of comparison, the amount of movement of a wafer in coating resin and transferring a pattern for s sets each including n shot areas according to the conventional technique is calculated below. In the conventional technique, the process of coating resin and transferring the pattern is performed for the total of n×s shot areas on a one-by-one basis. The amount of movement can be determined by substituting ns into n in equation (5.2) according to the third embodiment described above, and the result is given below.

$$2nsD+2nsW \quad (6.3)$$

From equations (6.1) and (6.3), it is derived that when the condition given by (6.4) shown below is satisfied, the total amount of movement of the wafer according to the present embodiment of the invention is smaller than that according to the conventional technique.

$$(n-1)(2s+1)sW+2sD+2sW<2nsD+2nsW$$

$$D>(s-1/2)W \quad (6.4)$$

The condition (6.4) described above is premised on the condition $D+W/2>(n-1)sW$, and in this case to ensure that the amount of movement of the wafer is smaller for the present embodiment of the invention, it is necessary to determine D and W such that the condition (6.4) is satisfied.

On the other hand, from equations (6.2) and (6.3), the condition (6.5) shown below can be derived.

$$(n-1)(4s-1)sW+sW+W+2D<2nsD+2nsW$$

$$D>(2s-3/2-((2s-1)(s-1))/(ns-1))W \quad (6.5)$$

The condition (6.5) described above is premised on the condition $D+W/2<(n-1)sW$, and in this case, to ensure that the amount of movement of the wafer is smaller for the present embodiment of the invention, it is necessary to determine D and W such that the condition (6.5) is satisfied. That is, inequalities (6.4) and (6.5) indicate conditions that need to be satisfied to achieve the advantages of the present embodiment.

The values of the parameters n and s are determined taking into account factors such as the locations of shot areas, the width W of each shot area, the characteristic of the resin, etc. By determining the values of n and s such that the condition (6.4) or (6.5) is satisfied, the advantages of the present embodiment of the invention can be achieved. In other words, when n and s are given, if checking is performed as to whether the condition (6.4) or (6.5) is satisfied, it is possible to determine whether the advantages of the present embodiment are achieved.

In any embodiment of the present invention, the value of n indicating the number of shot areas to be continuously subjected to coating of resin may be determined according to a mathematical expression indicating a condition to be met to minimize the movement of the wafer. The mathematical expression may include variables indicating the distance (D) between the coating unit and the mold and the width (W) of the shot area as seen in the direction parallel to the direction in which the holding unit and the coating unit are arranged, and the mathematical expression may represent the condition for the value of n to be satisfied to achieve the advantages of the invention. More specifically, an acquisition unit (not shown) may acquire the values of D and W and an arithmetic unit (not shown) may determine the value of n from the acquired values so as to satisfy the mathematical expression. The acquisition unit and the arithmetic unit may be disposed in the imprinting apparatus or may be disposed in an external processing apparatus connected to the imprinting apparatus. Thus the imprinting apparatus is capable of operating in a manner in which the advantages of the present invention are achieved according to n whose value is properly determined depending on parameters associated with the distance (D) between the coating unit and the mold and the width (W) of the shot areas even for a case where the parameters are allowed to vary.

In any embodiment of the present invention, information may be displayed on a display apparatus (not shown) of the imprinting apparatus IMP as to a layout of shot areas and/or sets of shot areas selected by the selection unit. The display apparatus may be disposed on the imprinting apparatus IMP, or the display apparatus may be disposed in the outside of the imprinting apparatus IMP and may be connected to the imprinting apparatus IMP. The information may be displayed, for example, such that shot areas may be displayed in different colors or symbols depending on whether shot areas have already been subjected to coating of resin or transferring of the pattern in the imprinting process thereby allowing a user to distinguish among these shot areas. This allows the user to know the layout of shot areas defined on the wafer before the imprinting process is started and also the status of each set of shot areas selected by the selection unit during the imprinting process. Thus, the user is allowed to change the configuration of each set of shot areas as required or specify particular shot areas that are not to be subjected to the imprinting process.

Figure 15:
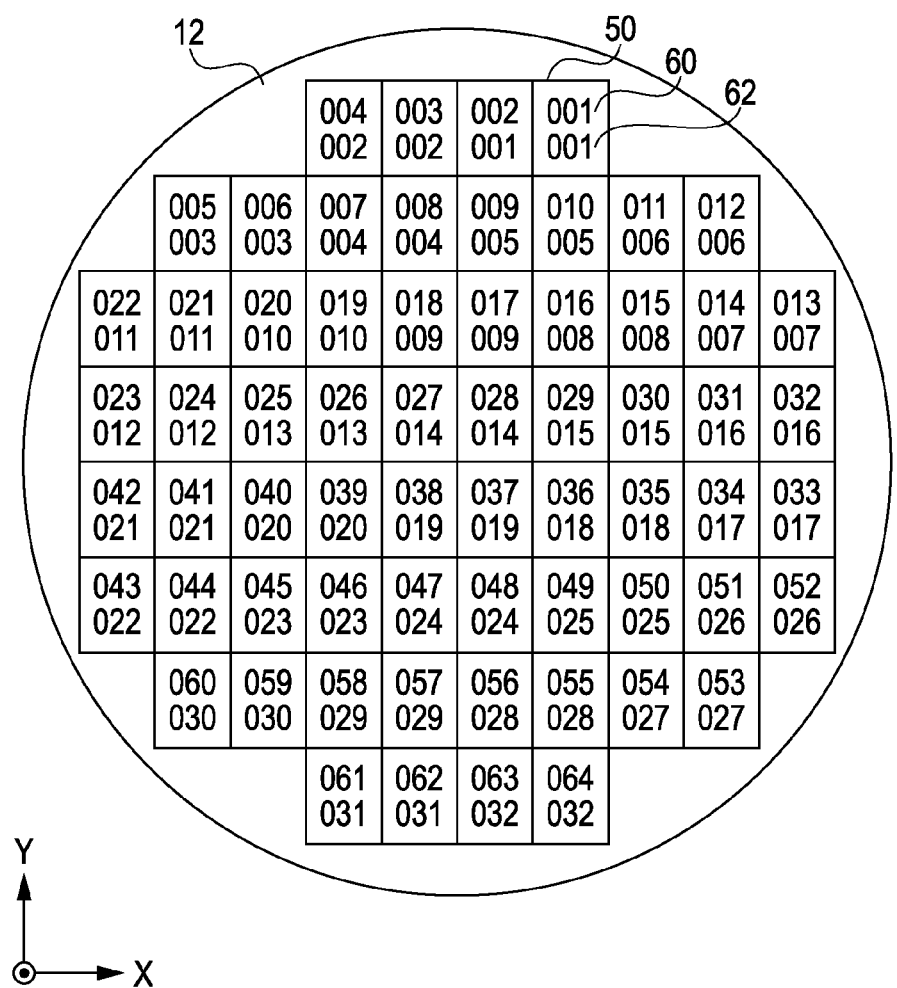
FIG. 15 is a diagram illustrating an example of a layout of shot areas displayed on a display apparatus.

FIG. 15 illustrates an example of a manner in which information associated with shot areas is displayed on the display apparatus. In this example, the layout of shot areas 50 defined on the wafer 12 is displayed on the display apparatus. The information displayed on the display apparatus includes a shot number 60 identifying each shot area and a set number 62 identifying each set of shot areas selected by the selection unit.

In the embodiments described above, it is assumed that the wafer 12 is held by the wafer stage 31 and the coating of resin and the transferring of the pattern are performed while moving the wafer stage 31. Alternatively, the wafer 12 may be maintained at a fixed location and, instead, the coating unit 32 and the imprint head 33 may be moved in the process of coating resin and transferring the pattern. There may be disposed a unit configured to move the coating unit 32. Instead of moving the shot area, the shot area may be maintained at a fixed location and the coating unit 32 may be moved horizontally during the process of coating resin. In the embodiments described above, it is assumed that the imprinting apparatus IMP includes only one coating unit. Alternatively, the imprinting apparatus IMP may additionally include a second coating unit disposed at a location symmetrical to the location of the coating unit 32 with respect to the imprint head, and the two coating units may be selectively used.

In the embodiments of the invention described above, it is assumed that shot areas are continuously subjected to the coating of resin and the transferring of the pattern in the same order so as to minimize the variation in the time spent before the transferring of the pattern is started after the coating of resin is completed.

In the embodiments of the invention described above, the photocuring process is employed to cure the resin. Alternatively, resin that is curable by heating the resin and then cooling it may be used to transfer a pattern to a wafer.

Various devices such as a semiconductor integrated circuit, a liquid crystal display device, etc. may be produced using a process including transferring of a pattern to a substrate such as a wafer, a glass plate, a film substrate, etc. using an imprinting apparatus. The process may include a step of etching the substrate having the transferred pattern. In the case of production of other devices such as a patterned medium (storage medium), an optical element, etc., the process may include a step other than the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-209541, filed Sep. 10, 2009, which is hereby incorporated by reference herein in its entirety.

What is claimed is:

1. An imprinting method for transferring a pattern of a mold to a resin dispensed on a substrate by using an imprinting apparatus including a holding unit configured to hold the mold, a dispensing unit configured to dispense the resin on the substrate and a selection unit that selects n shot areas on the substrate, the method comprising:

dispensing the resin in the n selected shot areas arranged in a direction parallel to a direction in which the holding unit and the dispensing unit are arranged where n is an integer equal to or greater than 2; and after the dispensing the resin in the n selected shot areas is performed, transferring the pattern to the n selected shot areas on a one-by-one basis, wherein in the dispensing the resin, while the substrate is being moved in a direction from the dispensing unit toward the holding unit, the resin is continuously dispensed in the n selected shot areas arranged on the substrate in a row in a direction from the holding unit toward the dispensing unit in order in the direction from the holding unit toward the dispensing unit, and the pattern is continuously transferred to the n selected shot areas in order in which the resin is dispensed in the n selected shot areas, wherein a distance D between the dispensing unit and the mold and a width W of each shot area as seen in the direction parallel to the direction in which the holding unit and the dispensing unit are arranged are selected so as to satisfy a condition $D > (3/2 - 1/n)W$, wherein the dispensing and the transferring are performed repeatedly on the substrate, wherein the selection unit determines n that satisfies the condition $D > (3/2 - 1/n)W$ based on the distance D and the width W, and selects n shot areas from a plurality of shot areas on a wafer based on the determined n, and wherein one shot area on the substrate corresponds to a pattern area formed on the mold.

2. An imprinting method for transferring a pattern of a mold to a resin dispensed on a substrate by using an imprinting apparatus including a holding unit configured to hold the mold, a dispensing unit configured to dispense the resin on the substrate and a selection unit that selects n shot areas on the substrate, the method comprising:

dispensing the resin in the n selected shot areas arranged in a direction parallel to a direction in which the holding unit and the dispensing unit are arranged where n is an integer equal to or greater than 2; and after the dispensing the resin in the n selected shot areas is performed, transferring the pattern to the n selected shot areas on a one-by-one basis, wherein in the dispensing the resin, while the substrate is being moved in a direction from the dispensing unit toward the holding unit, the resin is continuously dispensed in the n selected shot areas arranged on the substrate in a row in a direction from the holding unit toward the dispensing unit in order in the direction from the holding unit toward the dispensing unit, and the pattern is continuously transferred to the n selected shot areas in order in which the resin is dispensed in the n selected shot areas, wherein a distance D between the dispensing unit and the mold and a width W of each shot area as seen in the direction parallel to the direction in which the holding unit and the dispensing unit are arranged are selected so as to satisfy a condition $D > (3/2 - 1/n)W$, wherein the dispensing and the transferring are performed repeatedly on the substrate, wherein the selection unit determines n that satisfies the condition $D > (3/2 - 1/n)W$ based on the distance D and the width W, and selects n shot areas from a plurality of shot areas on a wafer based on the determined n, and wherein one shot area on the substrate corresponds to a pattern area formed on the mold, wherein the selection unit is configured to select the n shot areas such that each two adjacent shot areas of the n shot areas selected are at locations separated apart by a predetermined distance, and wherein the predetermined distance between the two adjacent shot areas of the n shot areas selected is larger than a width of the shot area.

3. The imprinting method according to claim 2, wherein the predetermined distance is an integral multiple of the width of the shot area.

4. An imprinting method for transferring a pattern of a mold to a resin dispensed on a substrate by using an imprinting apparatus including a holding unit configured to hold the mold, a dispensing unit configured to dispense the resin on the substrate and a selection unit that selects n shot areas on the substrate, the method comprising:

dispensing the resin in the n selected shot areas arranged in a direction parallel to a direction in which the holding unit and the dispensing unit are arranged where n is an integer equal to or greater than 2; and after the dispensing the resin in the n selected shot areas is performed, transferring the pattern to the n selected shot areas on a one-by-one basis;

wherein in the dispensing the resin, while the substrate is being moved in a direction from the holding unit toward the dispensing unit, the resin is continuously dispensed in the n selected shot areas arranged on the substrate in a row in a direction from the holding unit toward the dispensing unit in order in the direction from the dispensing unit toward the holding unit, and the pattern is continuously transferred to the n selected shot areas in order in which the resin is dispensed in the n selected shot areas, wherein a distance D between the dispensing unit and the mold and a width W of each shot area as seen in the direction parallel to the direction in which the holding unit and the dispensing unit are arranged are selected so as to satisfy a condition $D > W/2$, and wherein the dispensing and the transferring are performed repeatedly on the substrate, wherein the selection unit determines n when the distance D and the width W satisfy the condition $D > W/2$, and selects n shot areas from a plurality of shot areas on a wafer based on the determined n, and wherein one shot area on the substrate corresponds to a pattern area formed on the mold.

5. The imprinting method according to claim 1, wherein, in the transferring the pattern, the pattern is transferred to the shot area by bringing the resin into contact with the mold, curing the resin, and separating the cured resin from the mold, in each shot area, and wherein the dispensing and the transferring are performed repeatedly on the substrate.

6. The imprinting method according to claim 1, wherein the selection unit is configured to select the n shot areas such that each two adjacent shot areas of the n shot areas selected are at locations separated apart by a predetermined distance, and wherein the predetermined distance between the two adjacent shot areas of the n shot areas selected is larger than a width of the shot area.

7. The imprinting method according to claim 6, wherein the predetermined distance is an integral multiple of the width of the shot area.

8. The imprinting method according to claim 4, wherein the selection unit is configured to select the n shot areas such that each two adjacent shot areas of the n shot areas selected are at locations separated apart by a predetermined distance, and wherein the predetermined distance between the two adjacent shot areas of the n shot areas selected is larger than a width of the shot area.

9. The imprinting method according to claim 8, wherein the predetermined distance is an integral multiple of the width of the shot area.

* * * * *